(12) United States Patent
Lee et al.

(10) Patent No.: US 11,378,773 B2
(45) Date of Patent: Jul. 5, 2022

(54) LENS DRIVING APPARATUS, AND CAMERA MODULE AND OPTICAL DEVICE INCLUDING SAME

(71) Applicant: LG INNOTEK CO., LTD., Seoul (KR)

(72) Inventors: Jun Taek Lee, Seoul (KR); Kap Jin Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 871 days.

(21) Appl. No.: 16/093,077

(22) PCT Filed: Apr. 4, 2017

(86) PCT No.: PCT/KR2017/003665
§ 371 (c)(1),
(2) Date: Oct. 11, 2018

(87) PCT Pub. No.: WO2017/179845
PCT Pub. Date: Oct. 19, 2017

(65) Prior Publication Data
US 2019/0121055 A1 Apr. 25, 2019

(30) Foreign Application Priority Data

Apr. 12, 2016 (KR) .................. 10-2016-0044723

(51) Int. Cl.
*G02B 7/10* (2021.01)
*H04N 5/225* (2006.01)
(Continued)

(52) U.S. Cl.
CPC ............... *G02B 7/102* (2013.01); *G02B 7/08* (2013.01); *G02B 13/001* (2013.01);
(Continued)

(58) Field of Classification Search
CPC . G02B 7/102; G02B 7/10; G02B 7/08; G02B 13/009; G02B 27/646; G02B 7/04;
(Continued)

(56) References Cited

U.S. PATENT DOCUMENTS

2009/0086344 A1 4/2009 Furuya et al.
2012/0026611 A1 2/2012 Hu et al.
(Continued)

FOREIGN PATENT DOCUMENTS

CN 1933303 A 3/2007
CN 101133352 A 2/2008
(Continued)

*Primary Examiner* — Collin X Beatty
*Assistant Examiner* — Grant A Gagnon
(74) *Attorney, Agent, or Firm* — Birch, Stewart, Kolasch & Birch, LLP

(57) ABSTRACT

An embodiment comprises: a housing including first side parts and second side parts; a bobbin arranged inside the housing, and including first side parts corresponding to the first side parts of the housing and second side parts corresponding to the second side parts of the housing; a first coil arranged on an outer surface of the bobbin; a first magnet arranged on the first side parts of the housing; a second magnet arranged on any one among the second side parts of the bobbin; and a position sensor arranged on any one of the second side parts of the housing, and sensing a strength of the magnetic field of the second magnet, wherein the second magnet is located outside the first coil, and the outside of the first coil is an opposite side of a central side of the bobbin on the basis of the first coil.

23 Claims, 18 Drawing Sheets

(51) Int. Cl.
| | |
|---|---|
| *G02B 27/64* | (2006.01) |
| *G03B 3/10* | (2021.01) |
| *G02B 7/08* | (2021.01) |
| *G02B 13/00* | (2006.01) |
| *H05K 1/02* | (2006.01) |

(52) U.S. Cl.
CPC ............ *G02B 27/646* (2013.01); *G03B 3/10* (2013.01); *H04N 5/2253* (2013.01); *H04N 5/2254* (2013.01); *H05K 1/0274* (2013.01)

(58) Field of Classification Search
CPC ........ G02B 3/14; G02B 15/177; G02B 7/023; G02B 15/1425; G02B 15/143; G02B 15/145105; G02B 5/005; G02B 7/021; G02B 15/00; G02B 15/142; G02B 15/22; G02B 13/0075; G02B 13/26; G02B 15/14; G02B 15/1421; G02B 15/144109; G02B 15/144113; G02B 15/144511; G02B 15/1461; G02B 15/173; G02B 23/10; G02B 23/12; G02B 27/0006; G02B 7/105; G02B 7/38; G02B 13/0065; G02B 13/06; G02B 13/16; G02B 13/18; G02B 15/10; G02B 15/143503; G02B 15/145117; G02B 15/145121; G02B 15/145511; G02B 15/145527; G02B 15/1465; G02B 15/17; G02B 15/20; G02B 15/28; G02B 17/002; G02B 17/023; G02B 17/0615; G02B 17/0836; G02B 17/0856; G02B 17/0896; G02B 21/02; G02B 21/06; G02B 21/24; G02B 21/26; G02B 23/08; G02B 23/243; G02B 23/2438; G02B 23/2484; G02B 25/004; G02B 25/005; G02B 26/004; G02B 26/06; G02B 26/0833; G02B 26/0875; G02B 27/0018; G02B 27/0025; G02B 27/0093; G02B 27/022; G02B 27/1066; G02B 27/16; G02B 27/64; G02B 3/0081; G02B 5/06; G02B 5/305; G02B 6/04; G02B 6/32; G02B 7/002; G02B 7/02; G02B 7/022; G02B 7/026; G02B 7/028; G02B 7/06; G02B 7/09; G02B 7/28; G02B 7/30; G02B 7/36; G02B 7/365; G02B 7/40; G02B 9/64; G03B 3/10; G03B 17/04; G03B 2205/0046; G03B 13/36; G03B 17/00; G03B 17/17; G03B 2205/0007; G03B 2205/0084; G03B 2205/00; G03B 5/00; G03B 5/02; G03B 13/34; G03B 17/08; G03B 17/12; G03B 17/14; G03B 17/38; G03B 19/02; G03B 21/142; G03B 21/53; G03B 2217/002; G03B 2219/02; G03B 35/04; G03B 35/10; G03B 37/00; G03B 3/00; G03B 3/02; G03B 3/12; G03B 5/06; G03B 9/24; H04N 5/23296; H04N 5/2254; H04N 5/23203; H04N 5/23212; H04N 13/239; H04N 13/296; H04N 1/00397; H04N 1/00496; H04N 1/195; H04N 1/19594; H04N 2101/00; H04N 2201/0436; H04N 2213/001; H04N 5/2256; H04N 5/2257; H04N 5/232; H04N 5/23209; H04N 5/232121; H04N 5/232123; H04N 9/045; H04N 9/04557; H04N 9/07
USPC ........................................................ 359/694
See application file for complete search history.

(56) References Cited

U.S. PATENT DOCUMENTS

| | | |
|---|---|---|
| 2012/0314308 A1 | 12/2012 | Ikushima et al. |
| 2014/0177056 A1 | 6/2014 | Hayashi et al. |
| 2015/0177479 A1 | 6/2015 | Lee et al. |
| 2015/0253583 A1 | 9/2015 | Cho et al. |
| 2016/0209621 A1* | 7/2016 | Park .................. G02B 27/646 |
| 2017/0235094 A1 | 8/2017 | Osaka et al. |

FOREIGN PATENT DOCUMENTS

| | | |
|---|---|---|
| CN | 201116960 Y | 9/2008 |
| CN | 102016709 A | 4/2011 |
| CN | 102385131 A | 3/2012 |
| CN | 103185942 A | 7/2013 |
| CN | 103792640 A | 5/2014 |
| CN | 203745709 U | 7/2014 |
| CN | 104902149 A | 9/2015 |
| CN | 104977783 A | 10/2015 |
| CN | 105388582 A | 3/2016 |
| JP | 2011-138027 A | 7/2011 |
| JP | 2014-56031 A | 3/2014 |
| JP | 2014-126668 A | 7/2014 |
| JP | 2016-35600 A | 3/2016 |
| JP | 2016-38444 A | 3/2016 |
| KR | 10-2015-0128265 A | 11/2015 |
| KR | 10-2015-0123004 A | 12/2015 |
| KR | 10-2016-0000728 A | 1/2016 |
| KR | 10-2016-0089703 A | 7/2016 |
| TW | M519858 U | 4/2016 |
| WO | WO 2015/133759 A1 | 9/2015 |

* cited by examiner

US 11,378,773 B2

LENS DRIVING APPARATUS, AND CAMERA MODULE AND OPTICAL DEVICE INCLUDING SAME

CROSS REFERENCE TO RELATED APPLICATIONS

This application is the National Phase of PCT International Application No. PCT/KR2017/003665, filed on Apr. 4, 2017, which claims priority under 35 U.S.C. 119(a) to Patent Application No. 10-2016-0044723, filed in the Republic of Korea on Apr. 12, 2016, all of which are hereby expressly incorporated by reference into the present application.

TECHNICAL FIELD

Embodiments relate to a lens driving device and to a camera module and an optical apparatus including the same.

BACKGROUND ART

It is difficult to apply the technology of a voice coil motor (VCM) used in a conventional camera module to an ultra-small camera module while still realizing low power consumption thereof, and thus research has been actively conducted in relation thereto.

There is increasing demand for, and production of, electronic products such as smart phones and cellular phones equipped with cameras. Cameras for cellular phones have been increasing in resolution and decreasing in size, and accordingly, an actuator therefor is also becoming smaller, larger in diameter, and more multi-functional. In order to realize a high-resolution cellular phone camera, improvement in the performance of the cellular phone camera and additional functions, such as auto-focusing, shutter shaking prevention, and zooming in and out, are required.

DISCLOSURE

Technical Problem

Embodiments provide a lens driving device, which is capable of reducing a height in an optical-axis direction and preventing a reduction in output and sensing ability of a position sensor, and a camera module and an optical apparatus including the same.

Technical Solution

In one embodiment, a lens driving device includes: a housing including first side portions and second side portions; a bobbin disposed in the housing, the bobbin including first side portions corresponding to the first side portions of the housing and second side portions corresponding to the second side portions of the housing; a first coil disposed on an outer surface of the bobbin; a first magnet disposed on the first side portions of the housing; a second magnet disposed on one of the second side portions of the bobbin; and a position sensor disposed on one of the second side portions of the housing in order to sense the strength of the magnetic field of the second magnet, wherein the second magnet is located outside the first coil, and the outside of the first coil is a region that is opposite a center of the bobbin with respect to the first coil.

The length of one of the second side portions of the bobbin in the horizontal direction, on which the second magnet is disposed, may be greater than the length of any other of the second side portions of the bobbin in the horizontal direction.

The distance from the center of the bobbin to the outer surface of one of the second side portions of the bobbin, on which the second magnet is disposed, may be less than the distance from the center of the bobbin to the outer surface of any other of the second side portions of the bobbin.

The lens driving device may further include a third magnet disposed on any other of the second side portions of the bobbin that faces one of the second side portions of the bobbin on which the second magnet is disposed.

Among the second side portions of the bobbin, the length of each of the second side portions in the horizontal direction, on which the second magnet and the third magnet are disposed, may be greater than the length of each of the remaining second side portions in the horizontal direction, and the length of each of the second side portions in the horizontal direction, on which the second magnet and the third magnet are disposed, may be less than the length of each of the first side portions of the bobbin in the horizontal direction.

The distance from the center of the bobbin to the outer surface of each of the second side portions, on which the second magnet and the third magnet are disposed, may be less than the distance from the center of the bobbin to the outer surface of each of the remaining second side portions.

The third magnet may overlap the first coil in a direction perpendicular to an optical axis.

A first seating groove may be formed in the first side portions and the second side portions of the bobbin so as to be depressed from the outer surfaces of the first side portions and the second side portions so that the first coil is disposed in the first seating groove, and a second seating groove may be formed in each of the second side portions, on which the second magnet and the third magnet are disposed, so that the second magnet or the third magnet is inserted into and disposed in the second seating groove.

At an initial position of the bobbin, the position sensor may overlap the second magnet in a direction perpendicular to the optical axis.

The first side portions and the second side portions of the bobbin may be asymmetric in a transverse direction with respect to a first reference line and a second reference line, and may be symmetric in the transverse direction with respect to a third reference line. The first reference line may be a straight line that passes through the center of the bobbin and is parallel to a direction that is oriented from the center of the bobbin to any one of the first side portions of the bobbin, the second reference line may be a straight line that is perpendicular to the first reference line, and the third reference line may be a straight line that passes through the center of the bobbin and forms an internal angle of 45° with each of the first reference line and the second reference line.

The lens driving device may further include: an upper elastic member, which is coupled to the bobbin and the housing; and a printed circuit board, which is electrically connected to the position sensor, is disposed on any one of the second side portions of the housing, and is electrically connected to the upper elastic member.

The distance between one end of the first magnet and a first edge of the bobbin may be different from the distance between the opposite end of the first magnet and a second edge of the bobbin. The first edge may be an edge at which one end of each of the first side portions of the bobbin and one end of the second side portion of the bobbin 110, on which the second magnet is disposed, meet. The second edge may be an edge at which the opposite end of each of the first side portions of the bobbin and one end of the second side portion, on which the second magnet is not disposed, meet.

The length of a first region of the first magnet may be greater than the length of a second region of the first magnet. The first region may be a region from one end of the first magnet to a point thereof that corresponds to the first edge, and the second region may be a region from the opposite end of the first magnet to a point thereof that corresponds to the second edge.

The second magnet may overlap the first coil in a direction perpendicular to the optical axis. At the initial position of the bobbin, the position sensor may not overlap the first coil in a direction perpendicular to the optical axis.

In another embodiment, a lens driving device includes: a bobbin including first side portions and second side portions disposed between the first side portions; a first coil disposed on the outer surfaces of the first and second side portions of the bobbin; a housing accommodating the bobbin therein, the housing including first side portions corresponding to the first side portions of the bobbin and second side portions corresponding to the second side portions of the bobbin; a first magnet disposed on the first side portions of the housing in order to move the bobbin through interaction between the first magnet and the first coil; a second magnet disposed on a $2\text{-}1^{st}$ side portion of the second side portions of the bobbin so as to be located outside the first coil; and a position sensor disposed in the housing so as to be spaced apart from the first magnet in order to sense the strength of the magnetic field of the second magnet. The first side portions and the second side portions of the bobbin are asymmetric in a transverse direction with respect to a first reference line and a second reference line, and are symmetric in the transverse direction with respect to a third reference line. The first reference line is a straight line that passes through the center of the bobbin and is parallel to a direction that is oriented from the center of the bobbin to any one of the first side portions of the bobbin, the second reference line is a straight line that is perpendicular to the first reference line, and the third reference line is a straight line that passes through the center of the bobbin and forms an internal angle of 45° with each of the first reference line and the second reference line.

The lens driving device may further include a third magnet, which is disposed on a $2\text{-}2^{nd}$ side portion of the second side portions of the bobbin so as to be located outside the first coil.

The length of each of the $2\text{-}1^{st}$ side portion and the $2\text{-}2^{nd}$ side portion in the horizontal direction may be greater than the length of each of remaining $2\text{-}3^{rd}$ side portions, excluding the $2\text{-}1^{st}$ side portion and the $2\text{-}2^{nd}$ side portion, in the horizontal direction.

The $2\text{-}1^{st}$ side portion and the $2\text{-}2^{nd}$ side portion may face each other.

The distance from the center of the bobbin to the outer surface of each of the $2\text{-}1^{st}$ side portion and the $2\text{-}2^{nd}$ side portion may be less than the distance from the center of the bobbin to the outer surface of each of the $2\text{-}3^{rd}$ side portions.

The distance from the center of the bobbin to the second magnet may be greater than the distance from the center of the bobbin to the first coil.

In another embodiment, a lens driving device includes: a bobbin including first side portions, second side portions disposed between the first side portions, and a coil seating groove formed so as to be depressed from the outer surfaces of the first and second side portions; a first coil disposed in the coil seating recess in the bobbin; a housing accommodating the bobbin therein, the housing including first side portions corresponding to the first side portions of the bobbin and second side portions corresponding to the second side portions of the bobbin; a first magnet disposed on the first side portions of the housing in order to move the bobbin through interaction between the first magnet and the first coil; a second magnet disposed on any one of the second side portions of the bobbin; and a position sensor disposed in the housing in order to sense the strength of the magnetic field of the second magnet. The coil seating groove in the bobbin includes a bottom, on which the first coil is seated, a first protruding portion, which is located at one side of the bottom and protrudes from the bottom in a direction perpendicular to the optical axis, and a second protruding portion, which is located at the other side of the bottom and protrudes from the bottom in a direction perpendicular to the optical axis. The first protruding portion has therein a through-hole into which the second magnet is inserted, and the second magnet inserted into the through-hole is supported by the second protruding portion.

In another embodiment, a camera module includes: a lens barrel; the lens driving device according to the embodiment configured to move the lens barrel; and an image sensor configured to convert an image introduced through the lens driving device into an electric signal.

In a further embodiment, an optical apparatus includes: a display module including a plurality of pixels, a color of which is changed by an electric signal; the camera module according to the embodiment configured to convert an image introduced through a lens into an electric signal; and a controller configured to control the operation of the display module and the camera module.

Advantageous Effects

Embodiments may reduce a height in an optical-axis direction and may prevent a reduction in output and sensing ability of a position sensor.

DESCRIPTION OF DRAWINGS

FIG. 12a illustrates the output of the position sensor illustrated in FIG. 10a.

FIG. 13b illustrates the relationships between the driving current of the first coil and the displacement of the bobbin in the embodiment illustrated in FIG. 10a.

MODE FOR INVENTION

Figure 1:
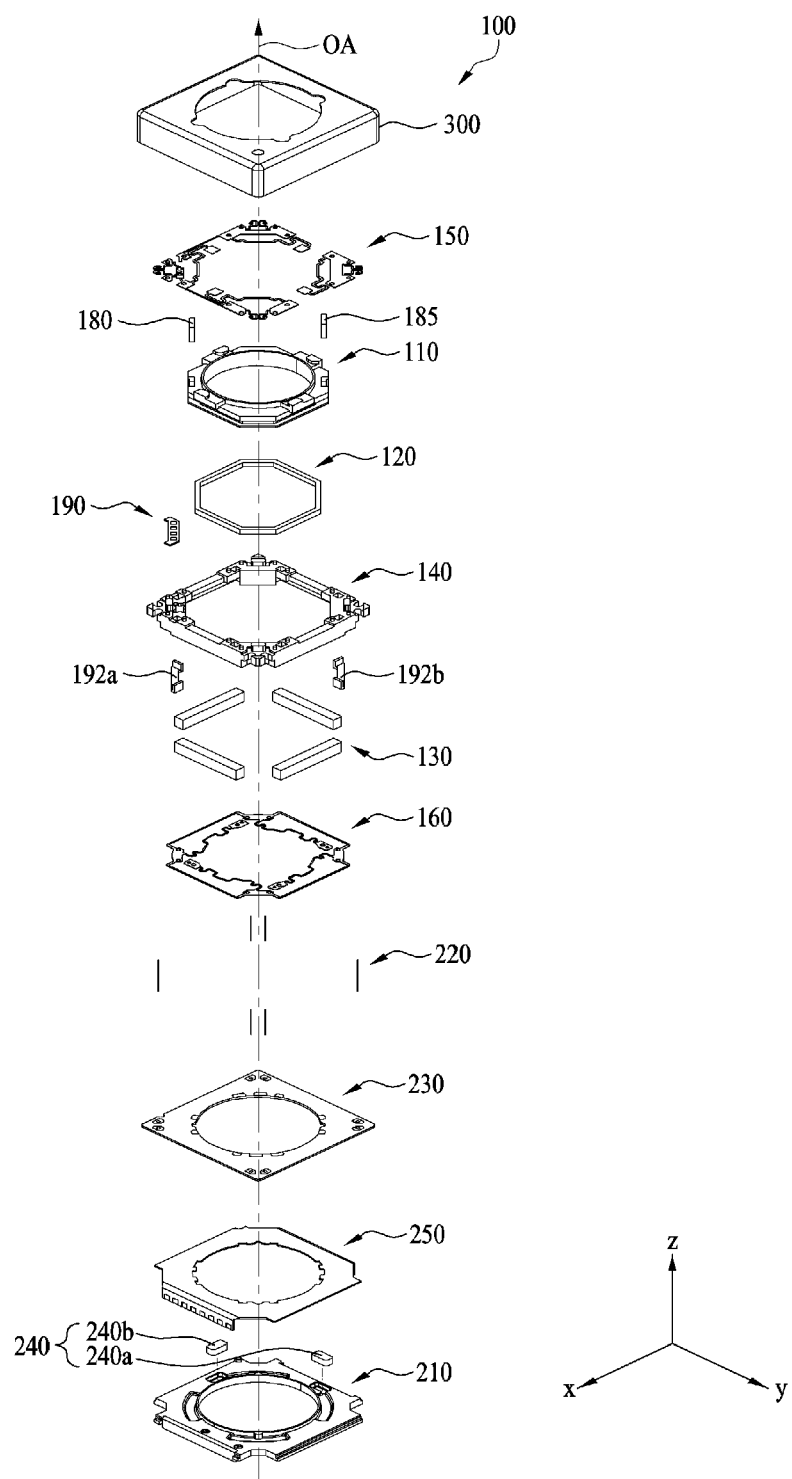
FIG. 1 illustrates an exploded perspective view of a lens driving device according to an embodiment.

Hereinafter, embodiments will become apparent with reference to the attached drawings and the description related thereto. In the description of the embodiments, it will be understood that when an element, such as a layer (film), a region, a pattern or a structure, is referred to as being "on" or "under" another element, such as a substrate, a layer (film), a region, a pad or a pattern, the term "on" or "under" means that the element is "directly" on or under another element or is "indirectly" formed such that an intervening element may also be present. In addition, it will also be understood that the criteria of "on" or "under" is on the basis of the drawings. In addition, the same reference numerals will denote the same elements via the description of the drawings.

Hereinafter, a lens driving device according to the embodiments will be described with reference to the accompanying drawings. For convenience of description, the lens driving device according to the embodiments will be described using a Cartesian coordinate system (x, y, z), but may be described using any other coordinate system, and the embodiments are not limited as to the coordinate system. In the drawings, an x-axis and a y-axis are directions perpendicular to a z-axis, which is an optical-axis direction. The z-axis direction, which is the optical-axis direction, may be referred to as a "first direction", the x-axis direction may be referred to as a "second direction", and the y-axis direction may be referred to as a "third direction".

A "hand-tremor compensation device" used in a small-sized camera module mounted in a mobile device, such as a smartphone or a tablet PC, is a device configured to prevent the outline of a captured image from being blurred due to vibration caused by the shaking of a user's hand when the image is captured.

In addition, an "auto-focusing device" is a device for automatically focusing an image of a subject on the surface of an image sensor. The hand-tremor compensation device and the auto-focusing device may be configured in various manners. A lens driving device according to the embodiments may perform a hand-tremor compensation operation and/or an auto-focusing operation by moving an optical module constituted by at least one lens in the first direction, which is parallel to the optical axis, or moving the optical module relative to a plane defined by the second and third directions, which are perpendicular to the first direction.

Figure 2:
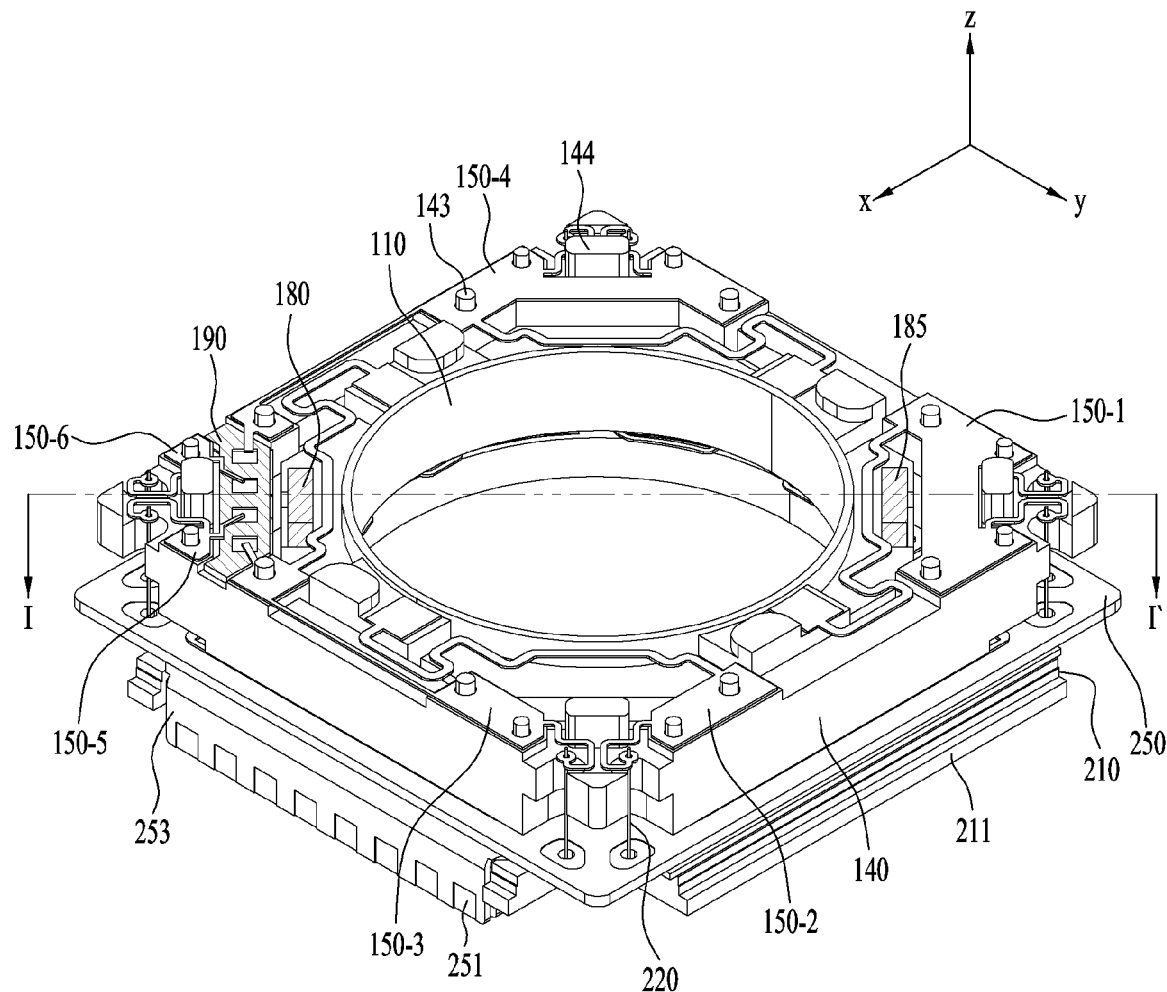
FIG. 2 illustrates an assembled perspective view illustrating the lens driving device excluding a cover member of FIG. 1.

FIG. 1 illustrates an exploded perspective view of a lens driving device 100 according to an embodiment, and FIG. 2 illustrates an assembled perspective view of the lens driving device excluding a cover member 300 of FIG. 1.

Referring to FIGS. 1 and 2, the lens driving device 100 includes a bobbin 110, a first coil 120, a first magnet 130, a housing 140, an upper elastic member 150, a lower elastic member 160, a first position sensor 170, and a second magnet 180.

In addition, the lens driving device 100 may further include a third magnet 185, a board 190, a support member 220, a second coil 230, a second position sensor 240, a circuit board 250, a base 210, and a cover member 300.

In addition, the lens driving device 100 may further include first and second yokes 192a and 192b coupled to the housing 140.

First, the cover member 300 will be described.

The cover member 300 accommodates the bobbin 110, the first coil 120, the first magnet 130, the housing 140, the upper elastic member 150, the lower elastic member 160, the first position sensor 170, the second magnet 180, the board 190, the support member 220, the second coil 230, the second position sensor 240, and the circuit board 250 in an accommodating space defined between the cover member and the base 210.

The cover member 300 may take the form of a box having an open bottom and an upper end portion and sidewalls, and the bottom of the cover member 300 may be coupled to the top of the base 210. The upper end portion of the cover member 300 may have a polygonal shape, for example, a rectangular shape, an octagonal shape, or the like.

The cover member 300 may have a hollow region formed in the upper end portion thereof to expose a lens (not illustrated), which is coupled to the bobbin 110, to external light. In addition, the hollow region in the cover member 300 may be additionally provided with a window formed of a light-transmitting material in order to prevent foreign substances, such as dust or moisture, from entering the inside of a camera module.

The cover member 300 may be formed of a nonmagnetic material such as SUS in order to prevent the cover member from adhering to the first magnet 130, but may be formed of a magnetic material to serve as a yoke.

Next, the bobbin 110 will be described.

The bobbin 110 is located inside the housing 140 and is movable in the optical-axis direction or the first direction, for example, the Z-axis direction, via electromagnetic interaction between the first coil 120 and the first magnet 130.

Figure 3A:
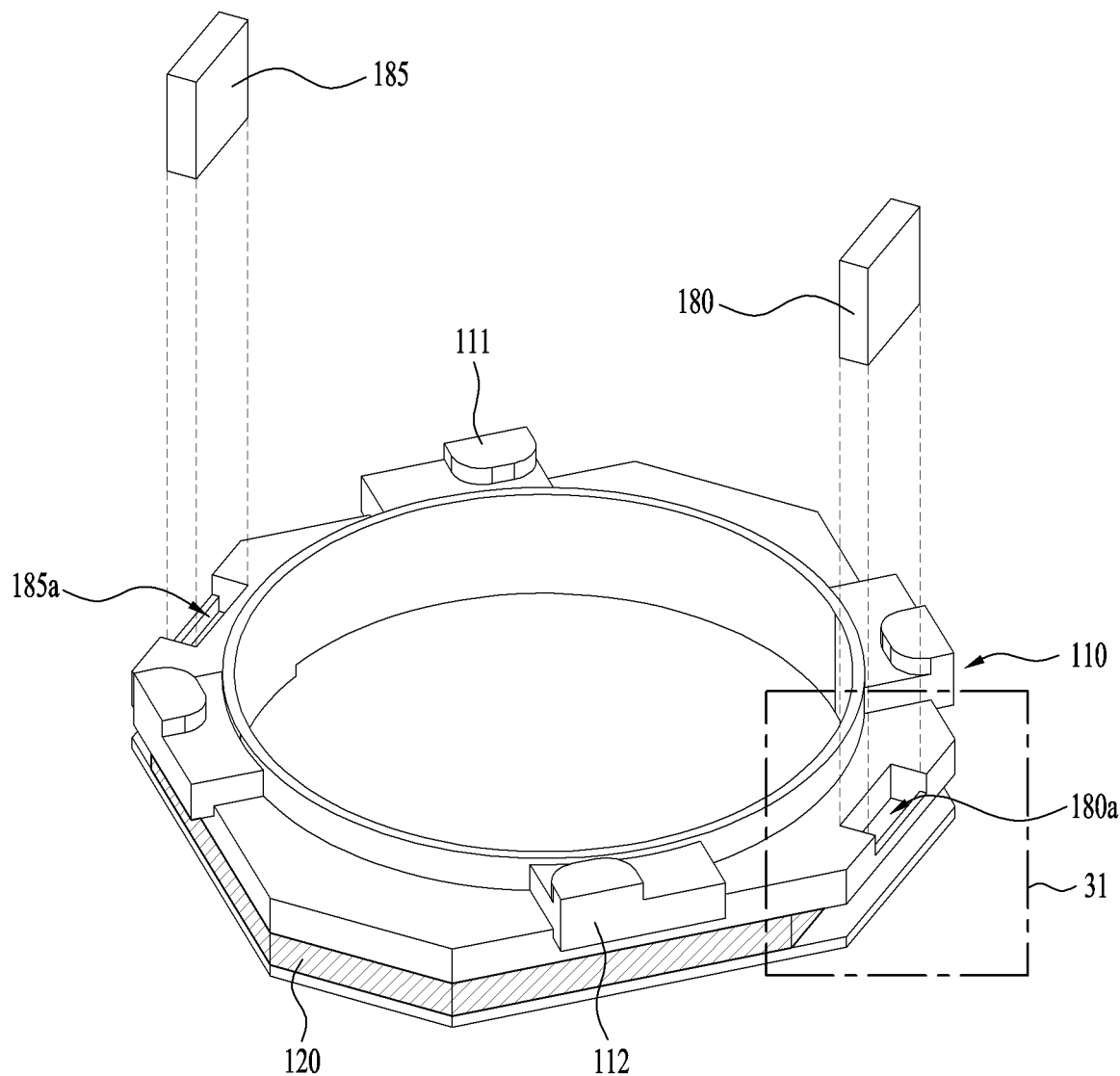
FIG. 3a illustrates a perspective view of a bobbin, a first coil, and second and third magnets illustrated in FIG. 1.
Figure 3B:
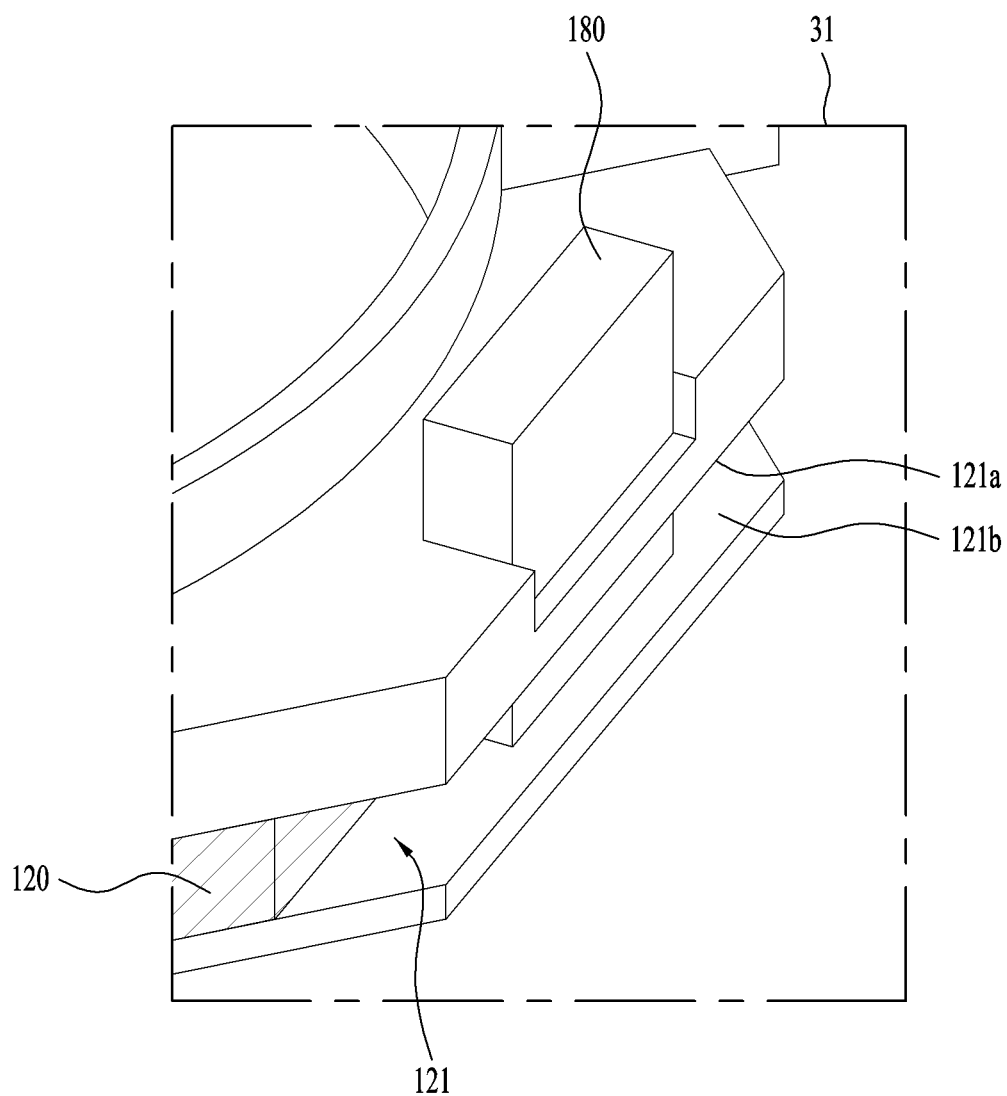
FIG. 3b illustrates an enlarged view of the first coil and the second magnet mounted to the bobbin.

FIG. 3a illustrates a perspective view of the bobbin 110, the first coil 120, and the second and third magnets 180 and 185 illustrated in FIG. 1, FIG. 3b illustrates an enlarged view of the first coil 120 and the second magnet 180 mounted to the bobbin 110, and FIG. 3a illustrates a plan view of the bobbin 110.

Figure 3C:
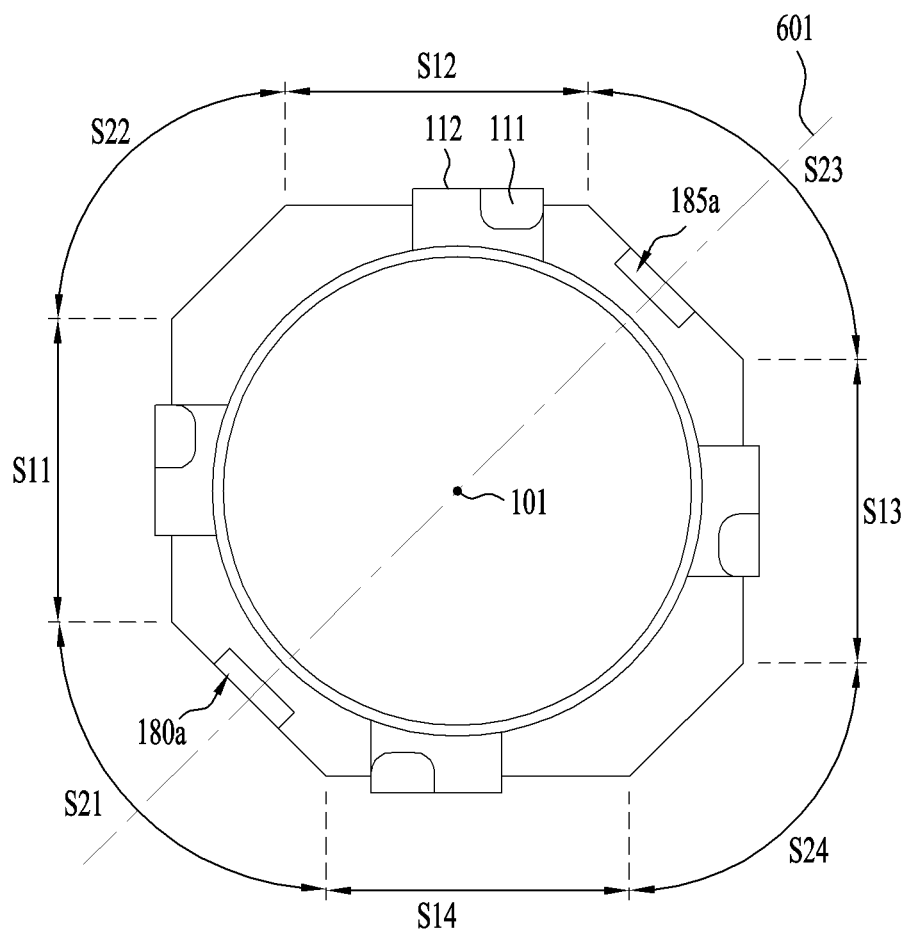
FIG. 3c illustrates a plan view of the bobbin.

Referring to FIGS. 3a to 3c, the bobbin 110 may include a lens barrel (not illustrated) in which at least one lens is provided, although not illustrated, and the lens barrel may be coupled inside the bobbin 110 in any of various manners.

The bobbin 110 may have a hollow region for mounting the lens or the lens barrel. The hollow region in the bobbin may have, for example, a circular shape, an elliptical shape, or a polygonal shape, without limitation thereto.

The bobbin 110 may include first side portions S11 to S14, which are spaced apart from each other, and second side portions S21 to S24, which are spaced apart from each other. In the bobbin 110, each of the first side portions S11 to S14 may be disposed between adjacent ones of the second side portions S21 to S24, and may connect the second side portions S21 to S24 to each other.

The bobbin 110 may be provided on the top surface thereof with a guide portion 111, which serves to guide the mounting position of the upper elastic member. For example, as illustrated in FIG. 3, the guide portion 111 of the bobbin 110 may protrude from the top surface of the bobbin in the first direction (for example, in the Z-axis direction) in order to guide the path through which a frame connection portion 153 of the upper elastic member 150 passes.

In addition, the bobbin 110 may include a protruding portion 112, which protrudes in the second and/or third direction, perpendicular to the first direction. An inner frame 151 of the upper elastic member 150 may be seated on the top surface 112 of the protruding portion 112 of the bobbin 110.

In the case in which the bobbin 110 moves in the first direction, which is parallel to the optical axis, or in a direction parallel to the first direction for the auto-focusing function, even when the bobbin 110 moves beyond a prescribed range due to external shocks or the like, the protruding portion 111 of the bobbin 110 may prevent the bobbin 110 from directly colliding with the housing 140.

For example, the guide portion 111 may be provided on the top surface of each of the first side portions S11 to S14 of the bobbin 110, and the protruding portion 112 may be provided on the outer surface of each of the first side portions S11 to S14 of the bobbin 110.

The bobbin 110 may include an upper support protrusion (not illustrated), which is coupled to and fixed to the upper elastic member 150. For example, the bobbin 110 may include at least one upper support protrusion (not illustrated), which protrudes from the top surface so as to be coupled to the inner frame 151 of the upper elastic member 150.

The bobbin 110 may have a coil seating groove 121, in which the first coil 120 is seated, inserted, or disposed. The coil seating groove 121 may be formed so as to be depressed from the outer surfaces of the first and second side portions S11 to S14 and S21 to S24 of the bobbin 110, and may have a shape that matches the shape of the first coil, for example, a ring shape.

For example, the coil seating groove 121 may include a bottom 121c (refer to FIG. 11), a first sidewall 121a, which is a first protruding portion that is located at one side (for example, an upper side) of the bottom 121c and that protrudes from the bottom 121c in a direction perpendicular to the optical axis, and a second sidewall 121b, which is a second protruding portion that is located at the other side (for example, a lower side) of the bottom 121c and that protrudes from the bottom 121c in the direction perpendicular to the optical axis.

The bobbin 110 may have a second-magnet seating slot 180a formed in the first sidewall 121a of the coil seating groove 121, in which the second magnet 180 is seated, inserted, fixed, or disposed.

The second-magnet seating slot 180a may take the form of a through-hole that penetrates the first sidewall 121a and communicates with the coil seating groove 121, without limitation thereto.

For example, a through-hole, into which the second magnet 180 is inserted, may be formed in the first sidewall 121a of the coil seating groove 121, but no through-hole may be formed in the second sidewall 121b. The second magnet 180, inserted into the second-magnet seating slot 180a, may come into contact with the second sidewall 121b of the coil seating groove 121 and may be supported by the second sidewall 121b. The second magnet 180 may be located outside the first coil 120 seated on the bottom of the coil seating groove 121.

The second-magnet seating slot 180a in the bobbin 110 may have a shape that matches the shape of the second magnet 180. A bond tank may be provided in the seating slot 180a in order to secure the second magnet 180.

In addition, the bobbin 110 may have a third-magnet seating slot 185a formed in the first sidewall 121a of the coil seating groove 121, in which the third magnet 185 is seated, inserted, fixed, or disposed.

The third-magnet seating slot 185a may take the form of a through-hole, and may be spaced apart from the second-magnet seating slot 180a.

For example, a through-hole, into which the third magnet 185 is inserted, may be formed in the first sidewall 121a of the coil seating groove 121, but no through-hole may be formed in the second sidewall 121b. The third magnet 185 inserted into the third-magnet seating slot 185a may come into contact with the second sidewall 121b of the coil seating groove 121 and may be supported by the second sidewall 121b. The third magnet 185 may be located outside the first coil 120 seated on the bottom of the coil seating groove 121.

The third-magnet seating slot 185a may have a shape that matches the shape of the third magnet 185.

The second-magnet seating slot 180a may be formed in any one of the second side portions S21 to S22 (for example, S21), and the third-magnet seating slot 185a may be formed in another one of the second side portions S21 to S22 (for example, S23).

The third-magnet seating slot 185a and the second-magnet seating slot 180a may be disposed so as to face each other. For example, the line 601 connecting the center of the third-magnet seating slot 185a and the center of the second-magnet seating slot 180a may pass through the center 101 of the bobbin 110. The reason for this is to arrange or align the second magnet 180 and the third magnet 185 in the bobbin 110 in a balanced manner relative to the first position sensor 170, thereby enabling accurate auto-focusing (AF) operation.

Next, the first coil 120 will be described.

The first coil 120 is disposed around the outer circumferential surface of the bobbin 110. The first coil 120 may be disposed in the second or third direction, which is perpendicular to the first direction, so as to overlap the second magnet 180 and the third magnet 185.

For example, the first coil 130 may be disposed in the coil seating groove 121, and the second magnet 180 may be inserted into the second-magnet seating slot 185a and may be located outside the first coil 120. Here, the outside of the first coil 120 may be a region that is opposite the center 101 of the bobbin 110 with respect to the first coil 120.

Each of the second magnet 180 and the third magnet 185, which are disposed in the bobbin 110, may be spaced apart from the first coil 120 in a direction perpendicular to the optical axis (OA), without limitation thereto. In another embodiment, each of the second magnet 180 and the third magnet 185, which are disposed in the bobbin 110, may be in contact with the first coil 120.

The first coil 120 may be implemented in the form of a ring that is wound around the outer circumferential surface of the bobbin 110 in a rotating direction about the optical axis (OA). For example, the first coil 120 may be inserted, disposed, or fixed in the coil seating groove 121 formed in the outer circumferential surface of the bobbin 110.

The coil seating groove 121 may be a ring-shaped groove that is depressed from the outer circumferential surface of the bobbin 110.

The first coil 120 may be directly wound around the outer circumferential surface of the bobbin 110, without limitation thereto. In another embodiment, the first coil 120 may be wound around the bobbin 110 using a coil ring, or may be implemented as an angled ring-shaped coil block.

When a driving signal (for example, driving current) is supplied, the first coil 120 may generate electromagnetic force via electromagnetic interaction between the first coil and the first magnet 130, and the bobbin 110 may be moved in the first direction by the generated electromagnetic force.

The first coil 120 may be disposed so as to correspond to the first magnet 130 disposed in the housing 140 or to overlap the same in a direction perpendicular to the optical axis. The first magnet 130 may be implemented in the form of a single body, and may be disposed so that the entire surface thereof facing the first coil 120 has the same polarity.

The first magnet 130 may be divided into two or four magnets with respect to the surface perpendicular to the optical axis (OA), and thus the surface of the first magnet 130, which faces the first coil 120, may also be divided into two or more surfaces, in which case the first coil 120 may also be divided into a number of coils that corresponds to the number of first magnets 130 resulting from the division.

Next, the housing 140 will be described.

The housing 140 supports the first magnet 130 and the first position sensor 170. In addition, the housing 140 may support the board 190.

The housing 140 may accommodate the bobbin 110 therein so as to allow the bobbin 110 to move in the first direction, which is parallel to the optical axis, due to electromagnetic interaction between the first coil 120 and the first magnet 130.

The housing 140 may generally have a hollow column shape. For example, the housing 140 may have a polygonal (e.g. a square or octagonal) or circular bore.

Figure 4A:
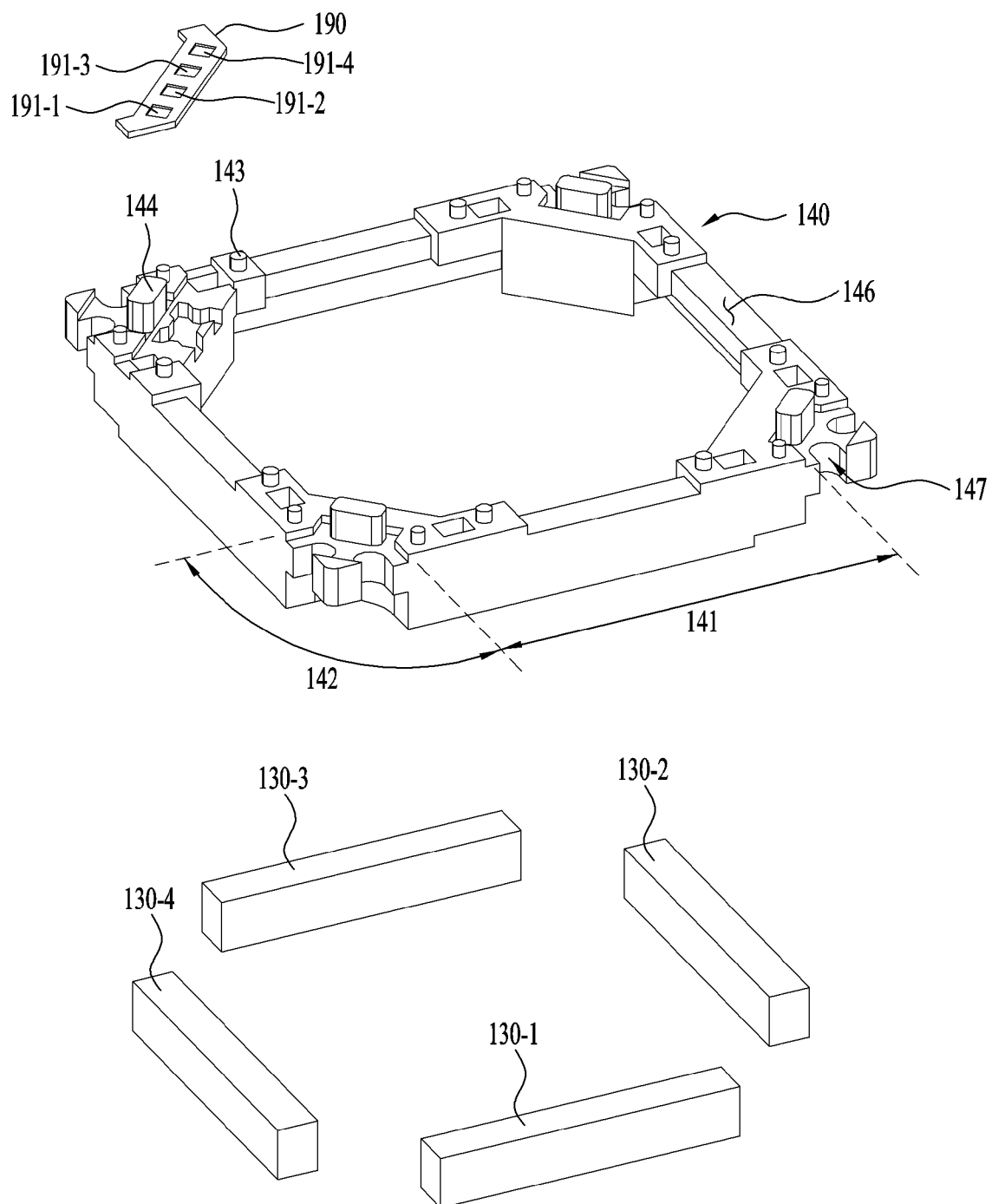
FIG. 4a illustrates a first exploded perspective view of a housing, a first position sensor, a board, and a first magnet illustrated in FIG. 1.
Figure 4B:
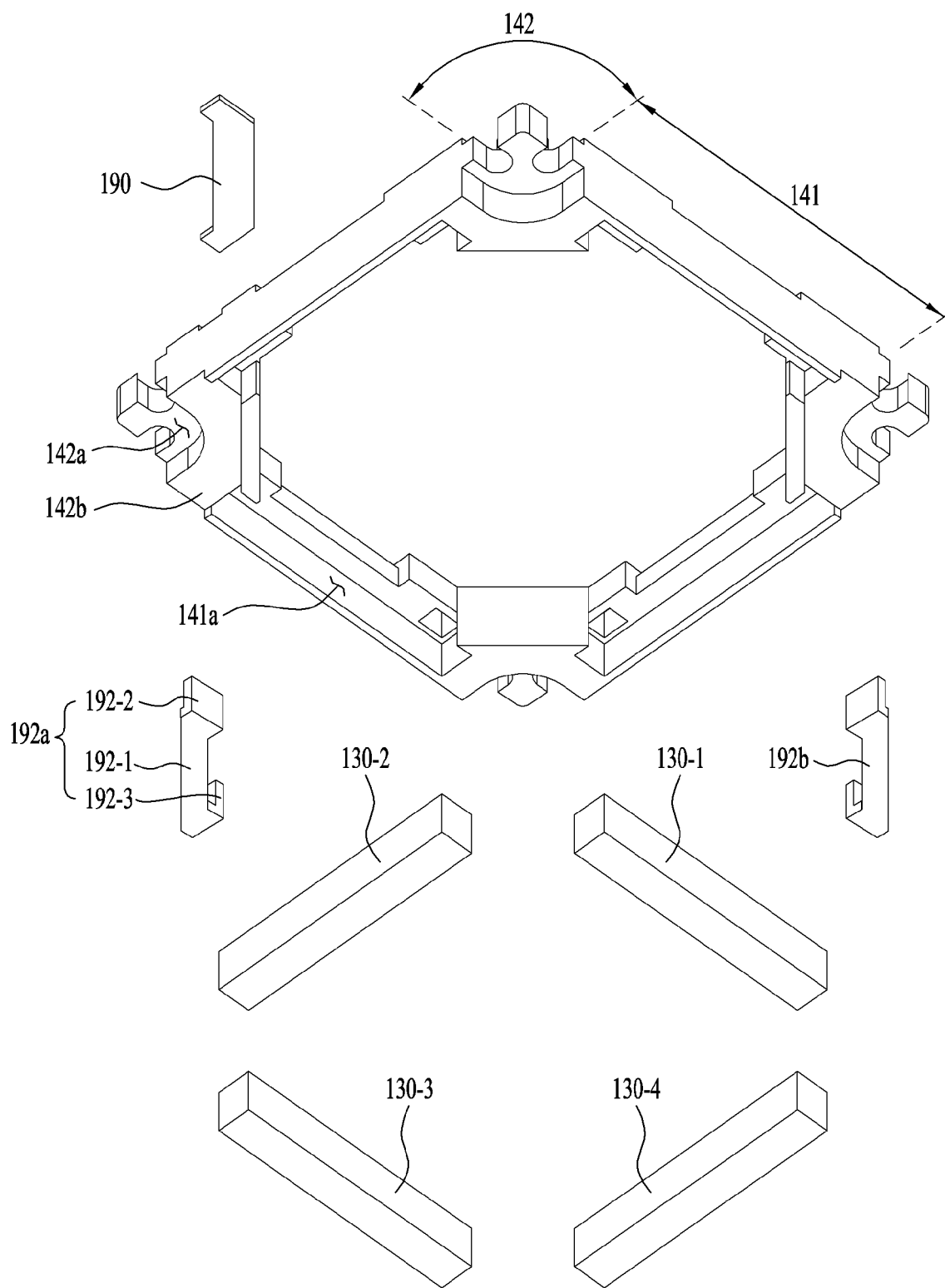
FIG. 4b illustrates a second exploded perspective view of the housing, the first magnet, and a yoke illustrated in FIG. 1.
Figure 5:
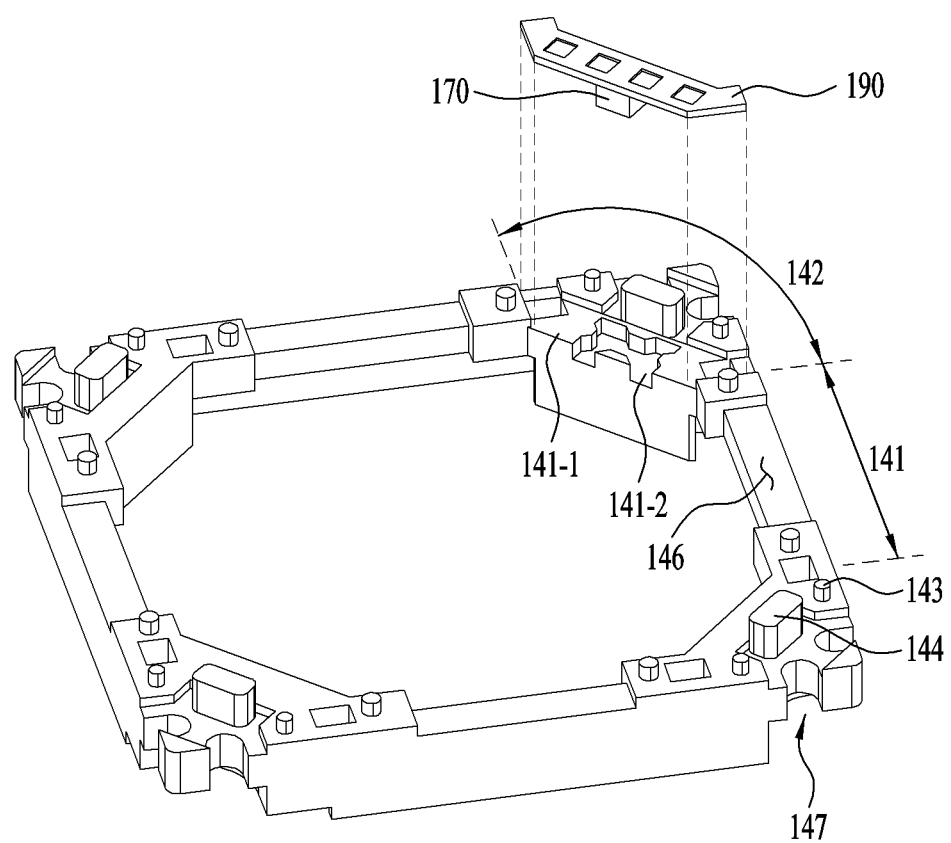
FIG. 5 illustrates mounting recesses formed in the housing for mounting the first position sensor and the board.

FIG. 4a illustrates a first exploded perspective view of the housing 140, the first position sensor 170, the board 190, and the first magnet 130 illustrated in FIG. 1, FIG. 4b illustrates a second exploded perspective view of the housing 140, the first magnet 130, and the yokes 192a and 192b illustrated in FIG. 1, and FIG. 5 illustrates mounting recesses 141-1 and 141-2 formed in the housing 140 for mounting the first position sensor 170 and the board 190.

Referring to FIGS. 4a to 5, the housing 140 may include a plurality of side portions 141 and 142. For example, the housing 140 may include first side portions 141, which are spaced apart from each other, and second side portions 142, which are spaced apart from each other. The length of each of the first side portions 141 of the housing 140 in the horizontal direction may be greater than the length of each of the second side portions 142 in the horizontal direction, without limitation thereto.

Each of the first side portions 141 of the housing 140 may correspond to the portion on which the first magnet 130 is installed. Each of the second side portions 142 of the housing 140 may be located between two adjacent first side portions 141, and may correspond to the portion on which the support member 220 is disposed.

The first side portions 141 of the housing 140 may connect the second side portions 142 of the housing 140 to each other and may include planes at a certain depth. Each of the first side portions 141 of the housing 140 may have an area equal to or greater than the area of the corresponding first magnet 130.

In order to avoid interference with the protruding portion 112 of the bobbin 110 when the bobbin 110 moves in the optical-axis (OA) direction, the housing 140 may have a seating groove 146 formed in the position corresponding to the protruding portion 112 of the bobbin 110.

The housing 140 may include a first-magnet seating portion 141a for accommodating the first magnet 130, a board mounting recess 141-1 for accommodating the board 190, and a first-position-sensor mounting recess 141-2 for accommodating the first position sensor 170.

The first-magnet seating portion 141a may be provided at an inner lower end of at least one of the first side portions 141 of the housing 140. For example, the first-magnet seating portion 141a may be provided at the inner lower end of each of four first side portions, and each of the first magnets 130 may be inserted into and fixed to a corresponding one of the first-magnet seating portions 141a.

The first-magnet seating portion 141a of the housing 140 may be formed as a recess corresponding to the size of the first magnet 130. An opening may be formed in the bottom surface of the first-magnet seating portion 141a of the housing 140, which faces the second coil 240, and the bottom surface of the first magnet 130 fixed to the first-magnet seating portion 141a may face the second coil 230.

The board mounting recess 141-1 may be formed in the upper portion or in the upper end of any one of the second side portions 142 of the housing 140. In order to facilitate installation of the board 190, the board mounting recess 141-1 may be formed as a recess that has an open upper portion, side surfaces, and a bottom, and may have therein an opening that communicates with the inside of the housing 140. The bottom of the board mounting recess 141-1 may have a shape that corresponds to or matches the shape of the board 190.

The first-position-sensor mounting recess 141-2 may be formed in the bottom of the board mounting recess 141-1. The first-position-sensor mounting recess 141-2 may be formed in a manner such that it is depressed from the bottom of the board mounting recess 141-1. For example, the first-position-sensor mounting recess 141-2 may be formed so as to contact the bottom of the board mounting recess 141-1 and the inner surface of the second side portion 141.

In order to facilitate installation of the first position sensor 170, the first-position-sensor mounting recess 141-2 may be formed as a recess that has an open upper portion, side surfaces, and a bottom, and may have therein an opening that communicates with the inside of the housing 140. The first-position-sensor mounting recess 141-2 may have a shape that corresponds to or matches the shape of the first position sensor 170.

The first magnet 130 and the board 190 may be fixed to the first-magnet seating portion 141a and the first-position-sensor mounting portion 141-2 of the housing 140 using an adhesive agent, without limitation thereto, and may alternatively be fixed using an adhesive member such as a piece of double-sided adhesive tape.

The first side portion 141 of the housing 140 may be disposed parallel to the side surface of the cover member 300. In addition, the area (or the length in the horizontal direction) of the first side portion 141 of the housing 140 may be greater than the area (or the length in the horizontal direction) of the second side portion 142.

The second side portion 142 of the housing 140 may have therein a through-hole 147, which defines a path through which the support member 220 passes. For example, the housing 140 may include the through-hole 147 that penetrates the upper portion of the second side portion 142. The through-hole 147 may be formed in a manner such that it is depressed from the outer surface of the second side portion 142 of the housing 140 and such that at least a portion thereof is exposed outside the second side portion 142. The number of through-holes 147 may be the same as the number of support members. The support member 220 may penetrate the through-hole 147 to be connected with the upper elastic member 150.

In addition, a stopper 144 may be provided on the upper end of the housing 140 in order to prevent direct collision with the inner surface of the cover member 300 illustrated in FIG. 1.

The housing 140 may include at least one upper support protrusion 143, which is coupled to an outer frame 152 of the upper elastic member 150.

For example, the upper support protrusion 143 of the housing 140 may be formed on the upper surface of at least one of the first side portions 141 or the second side portions 142 of the housing 140. The housing 140 may include a lower support protrusion (not illustrated), which is provided on the bottom surface thereof so as to be coupled to and fixed to an outer frame 162 of the lower elastic member 160.

In order to define a path through which the support member 220 passes and to secure a space to be filled with a gel-type silicon that may serve as a damper, the housing 140 may include a recess 142a formed in the lower portion or the lower end of the second side portion 142. The recess 142a in the housing 140 may be filled with, for example, a damping silicon for alleviating vibration of the support member 220.

In order to prevent the housing 140 from colliding with the cover member 300 when the housing 140 moves in the second direction and/or the third direction, the housing 140 may include at least one stopper (not illustrated), which protrudes from the outer surface of the respective first side portions 141.

In order to prevent the bottom surface of the housing 140 from colliding with the base 210 and/or the circuit board 250, which will be described below, the housing 140 may further include a stopper (not illustrated), which protrudes from the bottom surface. Through the provision of the stoppers formed on the top surface and the bottom surface of the housing 140, the housing 140 may be downwardly spaced apart from the base 210 and may be upwardly spaced apart from the cover member 300 so as to maintain the height thereof in the optical-axis (OA) direction without vertical interference. Thus, the housing 140 may perform the shifting operation in the second and third directions, which are the longitudinal direction and the transverse direction in the plane perpendicular to the optical axis.

Next, the first magnet 130 will be described.

The first magnet 130 may be disposed on each of the first side portions 141 of the housing 140.

The first magnet 130 may be disposed on the housing 140 such that at least a portion thereof overlaps the first coil 120 in a direction perpendicular to the optical axis (OA). For example, the first magnet 130 may be inserted into or disposed in the seating portion 141a of the housing 140.

In another embodiment, the first magnet 130 may be disposed on the outer surface of the first side portion 141 of the housing 140 or on the inner surface or the outer surface of the second side portion 142 of the housing 140.

The first magnet 130 may have a shape corresponding to the shape of the first side portion 141 of the housing 140, for example, a rectangular parallelepiped shape, without limitation thereto. The surface of the first magnet that faces the first coil 120 may be formed so as to correspond to or match the curvature of the corresponding surface of the first coil 120.

The first magnet 130 may be formed as one body, and may be disposed such that the surface thereof that faces the first coil 120 serves as an S-pole and the opposite surface serves as an N-pole. However, the disclosure is not limited thereto, and the poles of the magnet may be reversed.

At least two first magnets 130 may be provided on the first side portions of the housing 140, and may be arranged so as to face each other.

For example, the first magnets 130-1 to 130-4 may be disposed on the first side portions 141 of the housing 140. The first magnets 130-1 to 130-4 may be disposed on the first side portions 141 of the housing 140 in a manner such that two pairs of opposite magnets are arranged such that lines connecting the opposite magnets intersect each other. Here, each of the first magnets 130-1 to 130-4 may have a substantially rectangular planar surface, or alternatively may have a triangular or rhombic shape.

Among the second side portions of the housing 140, the second side portions of the housing 140, on which the second magnet 180 and the third magnet 185 are disposed, are provided on the lower ends thereof with yoke seating portions 142b, on which the first and second yokes 192a and 192b are disposed. The yoke seating portions 142b may be provided on the lower end of each of the second side portions 142 of the housing 140, located between the recess 142a in the housing 140 and the first-magnet seating portion 141a of the housing 140.

The first and second yokes 192a and 192b may reduce the influence of the magnetic field of the second and third magnets 180 and 185 on the first magnet 130.

The first and second yokes 192a and 192b are disposed on the second side portions of the housing 140, each of which is located between adjacent ones of the first magnets 130-1 to 130-4, which are adjacent to the second and third magnets 180 and 185 mounted to the bobbin 110. Thus, it is possible to increase the electromagnetic force between the first coil 120 and the first magnets 130-1 to 130-4.

For example, each of the first and second yokes 192a and 192b may include a body 192-1, a first bent portion 192-2, and a second bent portion 192-2. The body 192-1 may have a shape corresponding to the shape of the yoke seating portion 142 of the housing 140, and may be disposed so as to contact the yoke seating portion 142.

The first bent portion 192-2 may be bent from one end of the body 192-1, the second bent portion 192-3 may be bent from the opposite end of the body 192-1, and each of the first and second bent portions 192-2 and 192-3 may be bent in the same direction from the body 192-1.

The body 192-1 may be in contact with the yoke seating portion 142, the first bent portion 192-2 may be in contact with the outer surface of one of the first side portions 141 of the housing 140 that are in contact with the yoke seating portion 142, and the second bent portion 192-3 may be in contact with the outer surface of another one of the first side portions 141 of the housing 140 that are in contact with the yoke seating portion 142.

Next, the second and third magnets 180 and 185 will be described.

The second magnet 180 may be disposed in the second-magnet seating slot 180a in the bobbin 110, and a portion of one surface of the second magnet 180 that faces the first position sensor 170 may be exposed from the second-magnet seating slot 180a.

For example, each of the second and third magnets 180 and 185 may be disposed such that the interface between the N-pole and the S-pole may be parallel to a direction perpendicular to the optical axis, but the disclosure is not limited thereto. For example, in another embodiment, the interface between the N-pole and the S-pole may be parallel to the optical axis, but the disclosure is not limited thereto.

The second magnet 180 may be movable in the optical-axis direction together with the bobbin 110, and the first position sensor 170 may sense the strength of the magnetic field of the second magnet 180 that moves in the optical-axis direction. The displacement of the bobbin 110 in the optical-axis direction may be measured based on the strength of the magnetic field sensed by the first position sensor 170.

The magnetic field of the second magnet 180 may have an influence on the interaction between the first magnet 130 and the second coil 120. The third magnet 185 may serve to alleviate or eliminate the influence of the magnetic field of the second magnet 180 on the interaction between the first magnet 130 and the second coil 120.

In addition, the third magnet 185 may also serve as a counterweight for compensating for the weight of the second magnet 180 disposed on the bobbin 110.

For example, the third magnet 185 may be disposed on the second side portion S23 of the bobbin 110, which is located opposite the second side portion S21 of the bobbin 110 on which the second magnet 180 is disposed, so as to face the second magnet 180. This arrangement allows the magnetic field of the third magnet 185 to compensate for the magnetic field of the second magnet 180, which has an influence on the first magnet 130 and the first coil 120, thereby alleviating or eliminating the influence of the magnetic field of the second magnet 180 on the AF operation. As a result, the embodiment is capable of realizing accurate AF operation.

Figure 6:
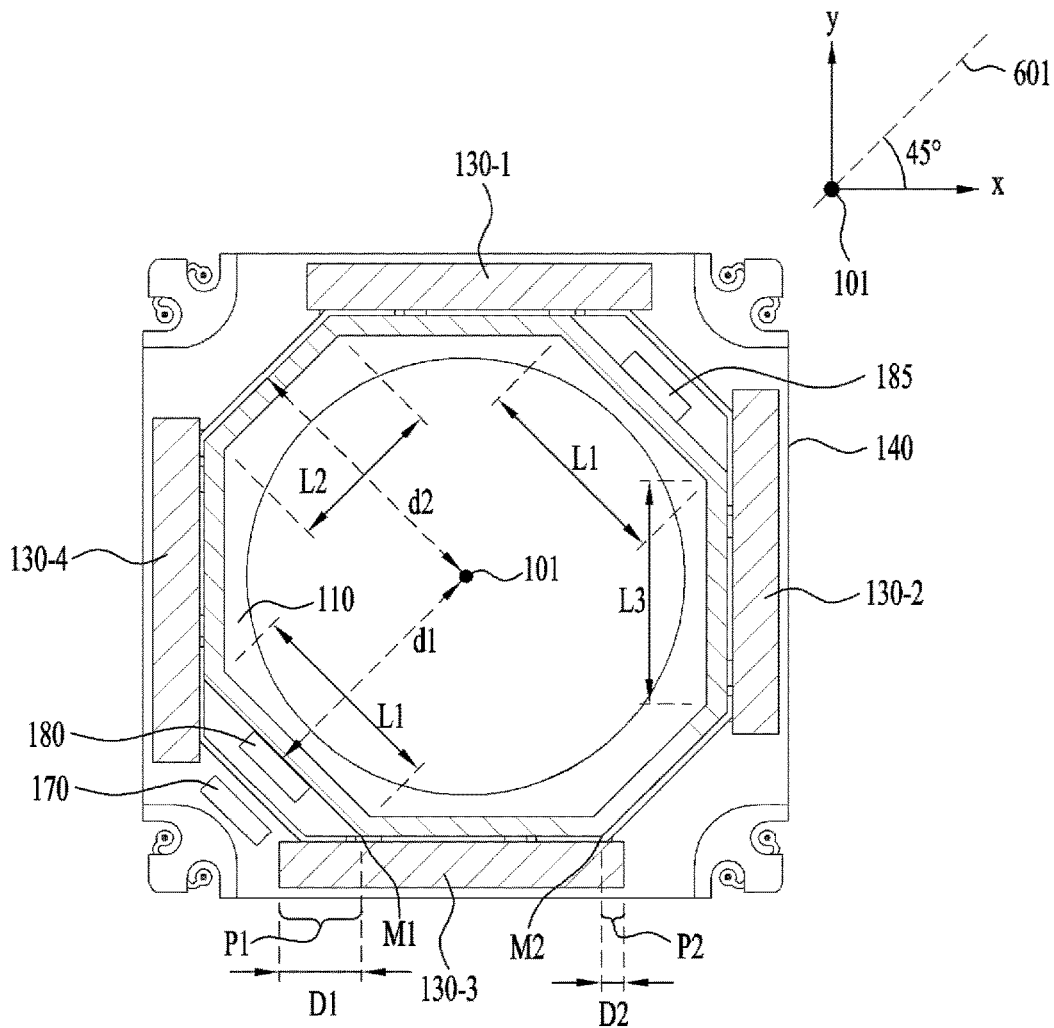
FIG. 6 illustrates the arrangement of the first coil and the second and third magnets disposed on the bobbin and the first magnet disposed in the housing.

FIG. 6 illustrates the arrangement of the first coil 120 and the second and third magnets 180 and 185 disposed on the bobbin and the first magnets 130 disposed in the housing 140.

Referring to FIGS. 3c and 6, the first side portions S11 to S14 of the bobbin 110 are located so as to correspond to, to face, or to be aligned with the first side portions 141 of the housing 140, and the second side portions S21 to S24 of the bobbin 110 are located so as to correspond to, to face, or to be aligned with the second side portions 142 of the housing 140.

Each of the second magnet and the third magnet 180 and 185 may be located outside the first coil 120, and the outside of the first coil 120 may be a region that is opposite the center 101 of the bobbin 110 with respect to the first coil 120.

The length of one of the second side portions S21 to S24 of the bobbin 110 in the horizontal direction, on which the second magnet 180 is disposed, may be greater than the length of any other of the second side portions S21 to S24 of the bobbin 110 in the horizontal direction.

For example, among the second side portions S21 to S24 of the bobbin 110, the length L1 of each of the 2-1$^{st}$ side portions S21 and S23 in the horizontal direction, on which the second and third magnets 180 and 185 are disposed, is greater than the length L2 (L1>L2) of each of the 2-2$^{nd}$ side portions S22 and S24 in the horizontal direction, on which the second and third magnets 180 and 185 are not disposed.

In addition, for example, the length L1 in the horizontal direction of each of the 2-1$^{st}$ side portions S21 and S23, on which the second and third magnets 180 and 185 are disposed, may be less than the length in the horizontal direction of each of the first side portions S12 to S14 of the bobbin 110.

The distance from the center of the bobbin 110 to the outer surface of one of the second side portions S21 to S24 of the bobbin 110, on which the second magnet 180 is disposed, may be less than the distance from the center 101 of the bobbin 110 to the outer surface of any other of the second side portions S21 to S24 of the bobbin 110.

For example, the distance d1 from the center 101 of the bobbin 110 to the outer surface of each of the 2-1$^{st}$ side portions S21 and S23 is less than the distance d2 (d1<d2) from the center 101 of the bobbin 110 to the outer surface of each of the 2-2$^{nd}$ side portions of the bobbin 110.

In addition, the length L1 in the horizontal direction of each of the 2-1$^{st}$ side portions S21 and S23 of the bobbin 110 may be less than the length L3 (L1<L3) in the horizontal direction of each of the first side portions S11 to S14 of the bobbin 110. In the case of L1≥L3, the length in the horizontal direction of each of the first side portions of the bobbin 110, which face the first magnet 130, is reduced. Therefore, the electromagnetic force due to the interaction between the first magnet 130 and the first coil 120 is decreased, and thus electromagnetic force suitable for AF operation may not be secured.

The distance D1 between one end of the first magnet 130 and a first edge M1 of the bobbin 110 is different from the distance D2 between the opposite end of the first magnet 130 and a second edge M2 of the bobbin 110.

For example, the distance D1 between one end of the first magnet 130-3 and the first edge M1 of the bobbin 110 may be greater than the distance D2 (D1>D2) between the opposite end of the first magnet 130 and the second edge M2 of the bobbin 110.

The first edge M1 may be an edge at which one end of each of the first side portions S11 to S14 of the bobbin 110 and one end of the 2-1$^{st}$ side portion S21 or S23 of the bobbin 110 meet. The second edge M2 may be an edge at which the opposite end of each of the first side portions S11 to S14 of the bobbin 110 and one end of the 2-2$^{nd}$ side portion S22 or S24, which is adjacent thereto, meet.

For example, the length of a first region P1 of the first magnet 130-3 may be greater than the length of a second region P2 of the first magnet 130-3. The first region P1 may be a region from one end of the first magnet 130-3 to a point thereof that corresponds to the first edge M1, and the second region P2 may be a region from the opposite end of the first magnet to a point thereof that corresponds to the second edge M2.

Since the 2-1$^{st}$ side portions S21 and S23 and the 2-2$^{nd}$ side portions S22 and S24 of the bobbin 110 have different lengths from each other in the horizontal direction, the outer surfaces of the first and second side portions S11 to S14 and S21 to S24 of the bobbin 110 may be asymmetric in the transverse direction with respect to a first reference line. For example, the first reference line may be an imaginary straight line that passes through the center of the bobbin 110 and is parallel to a direction (e.g. the X-axis) that is oriented from the center of the bobbin 110 to any one of the first side portions of the bobbin 110.

In addition, since the 2-1$^{st}$ side portions S21 and S23 and the 2-2$^{nd}$ side portions S22 and S24 of the bobbin 110 have different lengths from each other in the horizontal direction, the outer surfaces of the first and second side portions S1l to S14 and S21 to S24 of the bobbin 110 may be asymmetric in the transverse direction with respect to a second reference line (e.g. the Y-axis). The second reference line may be an imaginary straight line that is perpendicular to the first reference line.

In addition, the 2-1$^{st}$ side portions S21 and S23 of the bobbin 110, which face each other, may have the same length as each other in the horizontal direction, and the 2-2$^{nd}$ side portions S22 and S24 of the bobbin 110, which face each other, may have the same length as each other in the horizontal direction. Accordingly, the outer surfaces of the first and second side portions S11 to S14 and S21 to S24 of the bobbin 110 may be symmetric in the transverse direction with respect to a third reference line.

The third reference line 601 may be an imaginary straight line that passes through the center 101 of the bobbin 110 and forms an internal angle of 45° with each of the first and second reference lines (e.g. the X-axis and the Y-axis).

Here, the outer surfaces of the first and second side portions S11 to S14 and S21 to S24 of the bobbin 110 may be portions of the outer circumferential surface of the bobbin 110 in which the first coil 120 is disposed. For example, in the case in which the seating groove 121 for mounting the first coil 120 is formed in the first and second side portions S11 to S14 and S21 to S24 of the bobbin 110, the outer surfaces of the first and second side portions S11 to S14 and S21 to S24 of the bobbin 110 may be the bottom of the seating groove 121.

In addition, for example, the first magnets 130-1 to 130-4 may be arranged asymmetrically in the transverse direction with respect to the first and second reference lines, but the disclosure is not limited thereto. In another embodiment, the first magnets 130-1 to 130-4 may be arranged symmetrically in the transverse direction with respect to the first and second reference lines.

In addition, for example, the first magnets 130-1 to 130-4 may be arranged symmetrically in the transverse direction with respect to the third reference line 601, but the disclosure is not limited thereto. In another embodiment, the first magnets 130-1 to 130-4 may be arranged asymmetrically in the transverse direction with respect to the third reference line 601.

The first distance between one ends of the first magnets 130-1 to 130-4 that are adjacent to the 2-1$^{st}$ side portions S21 and S23 may be different from the second distance between one ends of the first magnets 130-1 to 130-4 that are adjacent to the 2-2$^{nd}$ side portions S22 and S24. For example, the first distance may be less than the second distance, but the disclosure is not limited thereto. In another embodiment, the first distance and the second distance may be the same as each other.

Figure 7:
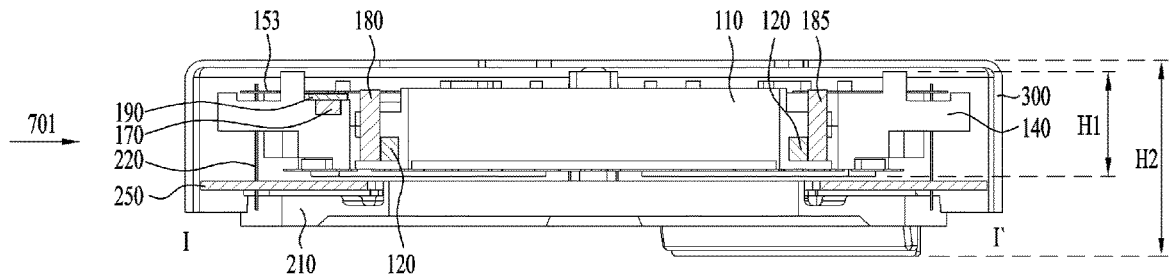
FIG. 7 illustrates a cross-sectional view taken along line I-I' of the lens driving device illustrated in FIG. 2.

FIG. 7 illustrates a cross-sectional view taken along line I-I' of the lens driving device illustrated in FIG. 2.

Referring to FIG. 7, each of the second and third magnets 180 and 185 may overlap the first coil 120 in a direction 701 that is perpendicular to the optical axis (OA).

In addition, the second magnet 180 may overlap or may be aligned with the third magnet 185 in the direction 701 that is perpendicular to the optical axis (OA).

In addition, at the initial position of the bobbin 110, the first position sensor 170 may overlap each of the second and third magnets 180 and 185 in the direction 701 that is perpendicular to the optical axis (OA), but the disclosure is not limited thereto. In another embodiment, the first position sensor 170 may not overlap at least one of the second and third magnets 180 and 185 in the direction 701 that is perpendicular to the optical axis (OA).

Next, the upper elastic member 150, the lower elastic member 160, and the support member 220 will be described.

The upper elastic member 150 and the lower elastic member 160 support the bobbin 110 using the elasticity thereof. The upper elastic member 150 is connected to the upper portion of the bobbin 110 and to the upper portion of the housing 140 so as to support the upper portion of the bobbin 110 and the upper portion of the housing 140. The lower elastic member 160 is connected to the lower portion of the bobbin 110 and to the lower portion of the housing 140 so as to support the lower portion of the bobbin 110 and the lower portion of the housing 140.

The support member 220 may movably support the housing 140 relative to the base 210 in a direction perpendicular to the optical axis, and may electrically connect at least one of the upper or lower elastic member 150 or 160 to the circuit board 250. For example, the support member 220 may electrically connect the upper elastic member 150 to the circuit board 250.

Figure 8:
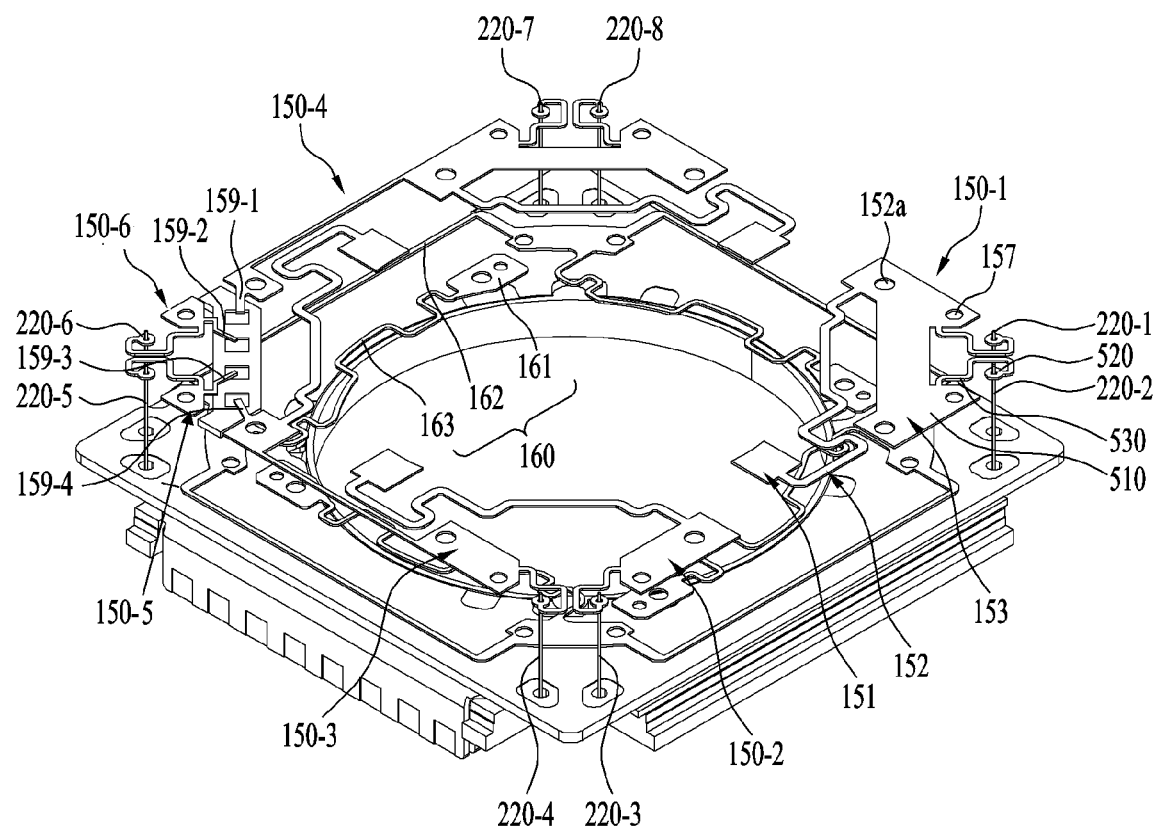
FIG. 8 illustrates an assembled perspective view of an upper elastic member, a lower elastic member, the first position sensor, the board, a base, a support member, and a circuit board illustrated in FIG. 1.

FIG. 8 illustrates an assembled perspective view of the upper elastic member 150, the lower elastic member 160, the first position sensor 170, the board 190, the base 210, the support member 220, and the circuit board 250 illustrated in FIG. 1.

Referring to FIG. 8, the upper elastic member 150 may be divided into two or more pieces. For example, the upper elastic member 150 may include multiple upper elastic members 150 (150-1 to 150-6), which are electrically separated from each other and are spaced apart from each other.

Each of pads 191-1 to 191-4 of the board 190 may be electrically connected to a corresponding one of the plurality of upper elastic members 150-1 to 150-6.

For example, each of the pads 191-1 to 191-4 of the board 190 is illustrated as being electrically connected to a corresponding one of the upper elastic members 150-1 to 150-6, but the disclosure is not limited thereto.

In another embodiment, the pads 191-1 to 191-4 of the board 190 may be electrically connected to the lower elastic member 160, or may be electrically connected both to the upper elastic member 150 and to the lower elastic member 160.

Each of the pads 191-1 to 191-4 of the board 190, which are electrically connected to the first position sensor 170, may be electrically connected to a corresponding one of the plurality of upper elastic members 150-1 to 150-6.

At least one of the upper elastic members 150-1 to 150-6 may be electrically connected to a corresponding one of the support members 220-1 to 220-8.

Each of the first to fourth upper elastic members 150-1 to 150-4 may include an inner frame 151 connected to the bobbin 110, an outer frame 152 connected to the housing 140, and a frame connection portion 153 connecting the inner frame 151 and the outer frame 152 to each other.

For example, in the case in which the bobbin 110 is provided with the upper support protrusion, the inner frame 151 may be provided with a through-hole (not illustrated), to which the upper support protrusion of the bobbin 110 is coupled.

For example, the outer frame 152 may be provided with a through-hole 152a, to which the upper support protrusion 143 of the housing 140 is coupled.

The inner frames of two upper elastic members selected from among the first to fourth upper elastic members 150-1 to 150-4 may be electrically connected to both ends of the first coil 120.

The outer frame 152 of each of the first to fourth upper elastic members 150-1 to 150-4 may be connected to at least one of the support members.

For example, the outer frame 152 of each of the first and fourth upper elastic members 150-1 and 150-4 may be respectively connected to two support members 220-1 and 220-2 & 220-7 and 220-8, and the outer frame of each of the second and third upper elastic members 150-2 and 150-3 may be respectively connected to one support member 220-3 and 220-4.

The frame connection portion 153 may be bent at least once to form a pattern having a predetermined shape. Upward movement and/or downward movement of the bobbin 110 in the first direction may be elastically supported by a change in position and micro-deformation of the frame connection portion 153.

Each of the fifth and sixth upper elastic members 150-5 and 150-6 is coupled to the housing 140 and is connected to a corresponding one of the support members 220-1 to 220-8.

For example, each of the fifth and sixth upper elastic members 150-5 and 150-6 may include an outer frame that is coupled to the housing 140.

The fifth and sixth upper elastic members 150-5 and 150-6 may be coupled only to the housing 140, rather than being coupled to the bobbin 110, and may elastically support the housing 140. That is, the fifth and sixth upper elastic members 150-5 and 150-6 may be spaced apart from the bobbin 110, rather than contacting the bobbin 110.

The outer frame of each of the fifth and sixth upper elastic members 150-5 and 150-6 may be connected to or coupled to one end of a corresponding one of the support members 220-5 and 220-6, and the other end of each of the support members 220-5 and 220-6 may be electrically connected to the circuit board 250 through a through-hole 230a formed in a circuit member 231.

The outer frame 152 of each of the first to sixth upper elastic members 150-1 to 150-6 may include a first coupling portion 510 coupled to the housing 140, a second coupling portion 520 coupled to a corresponding support member (e.g. 220-2), and a connection portion 530 connecting the first coupling portion 510 and the second coupling portion 520 to each other.

The support members 220-1 to 220-4 may be directly bonded to the second coupling portion 520 of the outer frame 152 of the upper elastic member 150 through soldering or using a conductive adhesive member (e.g. conductive epoxy), for example. The connection portion 530 of the outer frame 152 of each of the first and fourth upper elastic members 150-1 to 150-4 may be straight or bent at least once, and the width of the connection portion 530 may be less than the width of the frame connection portion 153 of the upper elastic member 150. Since the width of the connection portion 530 is less than the width of the frame connection portion 153 of the upper elastic member 150, the connection portion 530 may be easily moved in the first direction, which may disperse the stress applied to the upper elastic member 150 and the stress applied to the support member 220.

The outer frame 152 of at least one of the first to sixth upper elastic members 150-1 to 150-6 may include contact portions 159-1 to 159-4, which are in contact with or are connected to at least one of the pads 191-1 to 191-4 of the board 190.

For example, the outer frames of the third to sixth upper elastic members 150-3 to 150-6, which are adjacent to the second sidewall 142 of the housing 140, at which the board 190 is disposed, may respectively include contact portions 159-1 to 159-4, each of which is in contact with or is connected to a corresponding one of the pads 191-1 to 191-4 of the board 190.

The contact portions 159-1 to 159-4 may be expanded or extended from one ends of the outer frames of the third to sixth upper elastic members 150-3 to 150-6, and may come into direct contact with the pads 159-1 to 159-4 of the board 190.

The lower elastic member 160 may include an inner frame 161 coupled to the lower support protrusion of the bobbin 110, an outer frame 162 coupled to the lower support protrusion of the housing 140, and a connection portion 163 connecting the inner frame 161 and the outer frame to each other.

In FIG. 8, the lower elastic member 160 is not divided, but may be divided into two or more pieces in another embodiment.

Next, the support member 220 will be described.

The support member 220 may be disposed on each of the second side portions 142 of the housing 140. For example, two support members 220 may be disposed on each of four second side portions 142.

Alternatively, in another embodiment, among four second side portions 142 of the housing 140, only one support member may be disposed on each of two second side portions 142, and two support members may be disposed on each of two remaining second side portions 142.

Alternatively, in another embodiment, the support member 220 may be disposed in the form of a leaf spring on the first side portion 141 of the housing 140.

The support member 220, as described above, may define a path for transmitting a driving signal required for the first position sensor 170 and the first coil 120, and may also define a path, through which an output signal output from the first position sensor 170 is transmitted to the circuit board 250.

The support member 220 may be realized by a member capable of providing elastic support force, for example, a leaf spring, a coil spring, a suspension wire, or the like. In addition, in another embodiment, the support member 220 may be integrally formed with the upper elastic member.

The support members 220-1 to 220-8 may be spaced apart from the housing 140, and may be directly connected to the connection portion 530 of the outer frame 153 of the upper elastic member 150, rather than being fixed to the housing 140.

The connection portion 530 of the outer frame 153 of the upper elastic member 150 is spaced apart from the housing 140, and therefore is easily movable along the optical axis or in the first direction, which is parallel to the optical axis.

Since the support members 220-1 to 220-8 according to the embodiment are directly connected to the connection portion 530, which is easily movable in the first direction, the support members may more easily move along the optical axis or in the first direction, which is parallel to the optical axis, than a general support member fixed to the housing 140, which may improve the accuracy of hand-tremor compensation. In particular, stress due to dropping and impact may be dispersed, and consequently, deformation and disconnection of the support members 220-1 to 220-8 may be suppressed.

The first to sixth upper elastic members 150-1 to 150-6 may be electrically connected to the circuit board 250 through the support members 220-1 to 220-8.

Next, the first position sensor 170 and the board 190 will be described.

The first position sensor 170 may be disposed on any one of the second side portions 142 of the housing 140, and may sense the strength of the magnetic field of the second magnet.

The first position sensor 170 may be mounted on the board 190 disposed in the housing 140 and may move together with the housing 140 during hand-tremor compensation.

With the movement of the bobbin 110, the first position sensor 170 may sense the strength of the magnetic field of the second magnet 180 mounted to the bobbin 110, and may output an output signal based on the result of sensing.

The first position sensor 170 may be disposed on the bottom surface of the board 190. Here, the bottom surface of the board 190 may be a surface that faces the top surface of the housing 140 when the board 190 is mounted to the housing 140.

The first position sensor 170 may be implemented in the form of a driver including a hall sensor, or may be implemented as a position detection sensor alone, such as a hall sensor.

The first position sensor 170 may include two input terminals and two output terminals. Each of the input terminals and the output terminals of the first position sensor 170 may be electrically connected to a corresponding one of the pads 190-1 to 190-4 of the board 190.

The board 190 may include a circuit pattern or wiring (not illustrated) connecting the pads 190-1 to 190-4, disposed on the top surface thereof, and the first position sensor 170, disposed on the bottom surface thereof, to each other. For example, the board 190 may be a printed circuit board or an FPCB.

In another embodiment, the first position sensor 170 may be disposed on the top surface of the board 190, and the pads 190-1 to 190-4 may be disposed on the bottom surface of the board 190.

The pads 190-1 to 190-4 of the board 190 are electrically connected to the circuit board 250 by the third to sixth upper elastic members 150-3 to 150-6 and the support members 220-4 to 220-8, and therefore, the first position sensor 170 may be electrically connected to the circuit board 250.

In addition, both ends of the first coil 120 may be connected to the inner frames of the first and second upper elastic members 150-1 and 150-2, and may be electrically connected to the circuit board 250 by the first and second upper elastic members 150-1 and 150-2 and the support members 220-1 to 220-3.

Next, the base 210, the circuit board 250, and the second coil 230 will be described.

The base 210 may include a hollow region, which corresponds to the hollow region in the bobbin 110 and/or the hollow region in the housing 140, and may have a shape that matches or corresponds to the shape of the cover member 300, for example, a rectangular shape.

Figure 9:
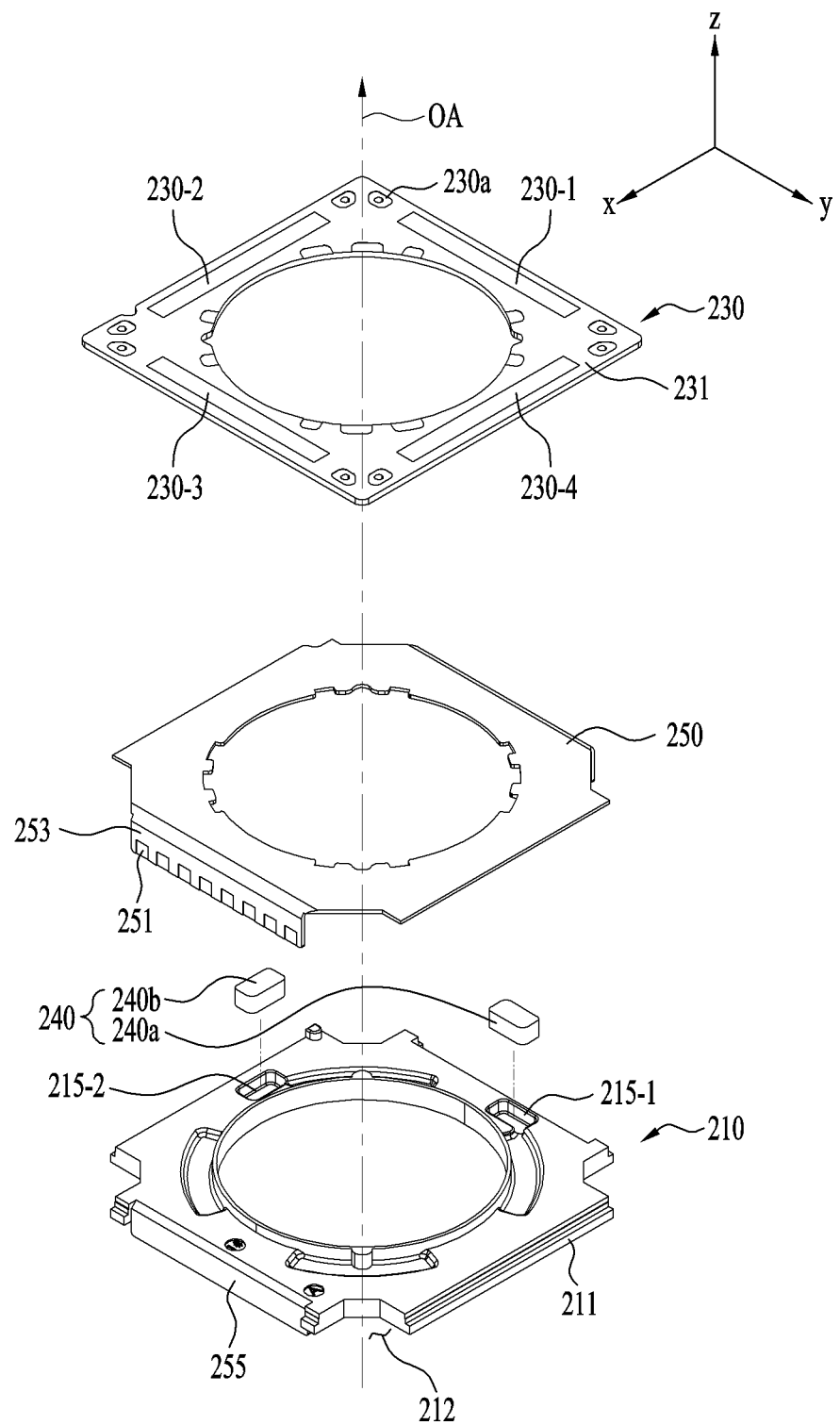
FIG. 9 illustrates an exploded perspective view of the base, a second coil, and the circuit board illustrated in FIG. 1.

FIG. 9 illustrates an exploded perspective view of the base 210, the second coil 230, and the circuit board 250 illustrated in FIG. 1.

Referring to FIG. 9, the base 210 may include a stepped portion 211 to which an adhesive may be applied when bonding and fixing the cover member 300. Here, the stepped portion 211 may guide the cover member 300 coupled to the upper side thereof, and may be coupled to the end of the cover member 300 in a surface-contact manner.

A support portion 255 may be formed on the surface of the base 210 that faces the portion of the circuit board 250 on which a terminal 251 is formed so as to have a size corresponding to the size of the surface of the base. The support portion 255 of the base 210 may be formed without the stepped portion 211 so as to have a certain cross section from the outer surface of the base 210, and may serve to support a terminal surface 253 of the circuit board 250.

The edge of the base 210 may have a recess 212. When the edge of the cover member 300 has a protruding shape, the protruding portion of the cover member 300 may be fastened to the recess 212 in the base 210.

In addition, the top surface of the base 210 may be provided with seating recesses 215-1 and 215-2 in which the second position sensor 240 may be disposed. According to the embodiment, the base 210 may be provided with two seating recesses 215-1 and 215-2, and the second position sensors 240 (240a and 240b) may be disposed in the seating recesses 215-1 and 215-2 in the base 210 so as to sense the degree of movement of the housing 140 in the second direction and the third direction. To this end, virtual lines connecting the centers of the seating recesses 215-1 and 215-2 in the base 210 and the center of the base 210 may intersect each other. For example, the angle formed by the virtual lines connecting the centers of the seating recesses 215-1 and 215-2 in the base 210 and the center of the base 210 may be 90°, without limitation thereto.

The second coil 230 may be disposed on the upper side of the circuit board 250, and the second position sensor 240 may be disposed on the lower side of the circuit board 250. The second position sensor 240 may sense the displacement of the housing 140 relative to the base 210 in a direction (e.g. the X-axis or Y-axis) perpendicular to the optical axis (e.g. the Z-axis).

The second position sensor 240 may include two sensors 240a and 240b, which are arranged so as to be perpendicular to each other in order to sense the displacement of the housing 140 in a direction perpendicular to the optical axis and which sense a change in the magnetic force of the first magnet 130 due to the movement of the housing 140 and output a signal (e.g. sensed voltage) based on the result of sensing.

The circuit board 250 may be disposed on the top surface of the base 210, and may have a hollow region corresponding to the hollow region in the bobbin 110, the hollow region in the housing 140, and/or the hollow region in the base 210. The shape of the outer circumferential surface of the circuit board 250 may have a shape that matches or corresponds to the shape of the top surface of the base 210, for example, a rectangular shape.

The circuit board 250 may include at least one terminal surface 253, which is bent from the top surface thereof and on which a plurality of terminals 251 or pins is provided to receive electric signals from the outside.

In FIG. 9, the second coil 230 is provided in a circuit member 231 separate from the circuit board 250, but the disclosure is not limited thereto. In another embodiment, the second coil 230 may be implemented in the form of a ring-shaped coil block, may be implemented in the form of an FP coil, or may be implemented in the form of a circuit pattern formed on the circuit board 250.

The second coil 230 may include a through-hole 230a formed through the circuit member 231. The support member 220 may be electrically connected to the circuit board 250 by passing through the through-hole 230a.

The second coil 230 is disposed on the circuit board 250 so as to face the first magnet 130 disposed on the housing 140.

The second coil 230 may include four coils 230-1 to 230-4, each of which is disposed on a corresponding one of the four sides of the circuit board 250, but the disclosure is not limited thereto. Only two coils may be provided respectively in the second direction and the third direction, or more than four coils may be provided.

Hand-tremor compensation may be performed when the housing 140 moves in the second direction and/or the third direction due to the interaction between the first magnet 130 and the second coil 230, which are disposed so as to face each other.

The second position sensor 240 may be provided as a hall sensor, or any other sensor capable of sensing the strength of a magnetic field may be used. For example, the second position sensor 240 may be implemented in the form of a driver including a hall sensor, or may be implemented as a position detection sensor alone, such as a hall sensor.

The plurality of terminals 251 may be provided on the terminal surface 253 of the circuit board 250. For example, the plurality of terminals 251 provided on the terminal surface 253 of the circuit board 250 may receive external driving signals so as to supply the driving signals to the first and second coils 120 and 230 and the first and second position sensors 170 and 240, and may output signals output from the first and second position sensors 170 and 240 to the outside.

According to the embodiment, the circuit board 250 may be provided as an FPCB, without limitation thereto, and the terminals of the circuit board 250 may be directly formed on the surface of the base 210 using a surface electrode method or the like.

The support member 220 may be electrically connected to a circuit pattern (not illustrated), which is formed on the top surface of the circuit board 250, using soldering or the like, but the disclosure is not limited thereto.

In another embodiment, the circuit board 250 may include a through-hole (not illustrated), through which the support member 220 may pass. The support member 220 may be electrically connected to a corresponding circuit pattern, which may be disposed on the bottom surface of the circuit board 250, through the through-hole (not illustrated) in the circuit board 250 using soldering or the like.

A coupling protrusion (not illustrated) may be provided on the top surface of the base 210 in order to couple the circuit board 250 to the base 210. The circuit board 250 may have therein a through-hole (not illustrated), into which the coupling protrusion of the base 210 is coupled. The circuit board 250 may be fixed to the base 210 through thermal bonding or using an adhesive member such as an epoxy or the like.

Figure 10A:
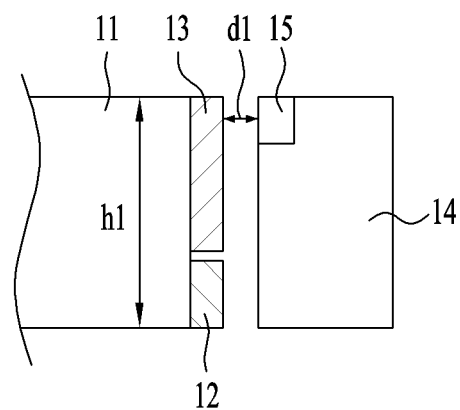
FIG. 10a illustrates an example of the arrangement of the first coil and the second magnet mounted to the bobbin and the position sensor disposed in the housing.

FIG. 10a illustrates an example of the arrangement of the first coil 12 and the second magnet 13 mounted to the bobbin 11 and the position sensor 15 disposed in the housing 14.

Referring to FIG. 10a, the first coil 12 and the second magnet 13 are arranged on the outer circumferential surface of the bobbin 11 so as to avoid overlapping in a direction perpendicular to the optical axis, and therefore, the distance d1 between the second magnet 13 and the first position sensor 15 may be decreased, thus increasing the output and sensing ability of the position sensor 15.

However, because the first coil 12 and the second magnet 13 are arranged on the outer circumferential surface of the bobbin 11 so as to avoid overlapping in a direction perpendicular to the optical axis, the length h1 of the bobbin 11 in the optical-axis direction must be set to be equal to or greater than the sum of the length of the first coil 12 and the length of the second magnet 13 in the optical-axis direction. This may impose a limitation on reduction in the length of the bobbin 11 in the optical-axis direction, and may impose a limitation on reduction in the thickness of a lens driving device or an optical instrument, such as a cellular phone, including the same.

For example, the length of the second magnet 13, which is formed of a neodymium material, in the optical-axis direction may be minimized to 1.0 mm. However, in the structure in which the first coil 12 and the second magnet 13 are arranged so as to avoid overlapping, it is difficult to reduce the height of the driving unit (the region corresponding to H1 of FIG. 7) to 3.5 mm or less. For example, the driving unit may include a housing, a bobbin, and elements mounted to the housing and the bobbin, and H1 may be the distance from the highest point of the driving unit to the lowest point thereof.

Figure 10B:
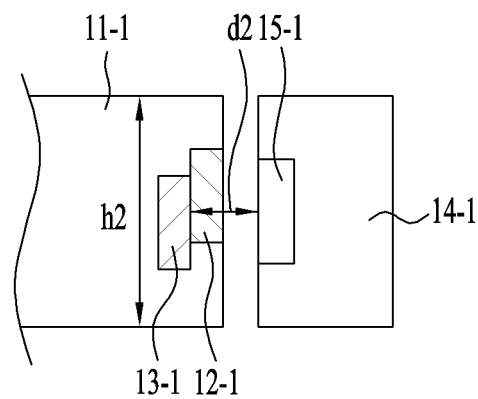
FIG. 10b illustrates another example of the arrangement of the first coil and the second magnet mounted to the bobbin and the position sensor disposed in the housing.

FIG. 10b illustrates another example of the arrangement of the first coil 12-1 and the second magnet 13-1 mounted to the bobbin 11-1 and the position sensor 15-1 disposed in the housing 14-1.

Referring to FIG. 10b, the first coil 12-1 and the second magnet 13-1 are arranged on the outer circumferential surface of the bobbin 11-1 so as to overlap each other in a direction perpendicular to the optical axis, and therefore, the length h2 of the bobbin 11-1 in the optical-axis direction may be set to be less than the sum of the length of the first coil 12-1 and the length of the second magnet 13-1 in the optical-axis direction.

However, because the second magnet 13-1 is disposed inside the first coil 12-1, the distance d2 between the second magnet 13-1 and the first position sensor 15-1 becomes greater than the distance d1 of FIG. 10a, thus lowering the output and sensing ability of the position sensor 15-1. For example, d2 may become greater than d1 by the length of the first coil 120 or more in a direction perpendicular to the optical axis.

Figure 12A:
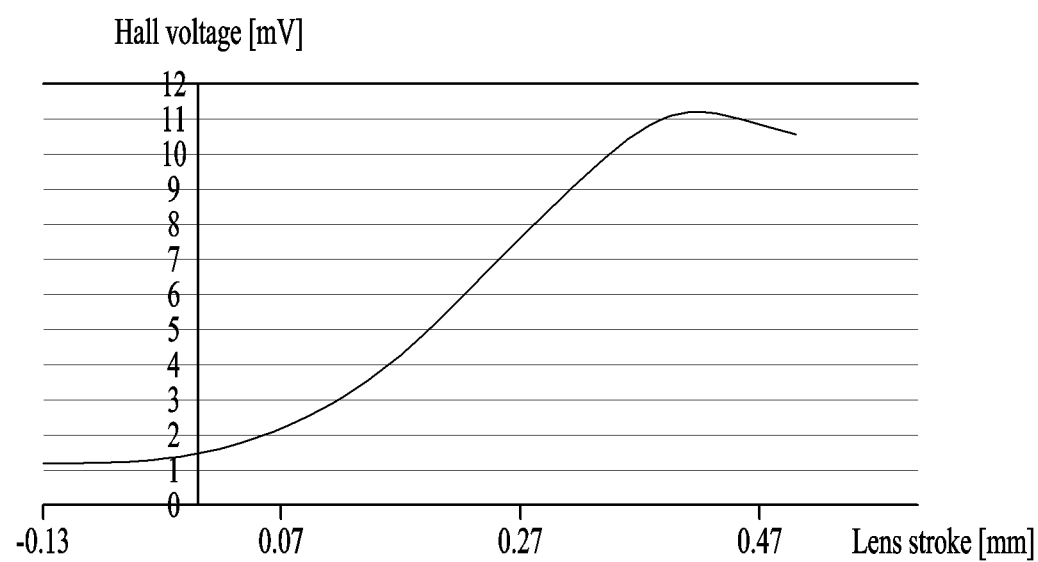
Figure 12B:
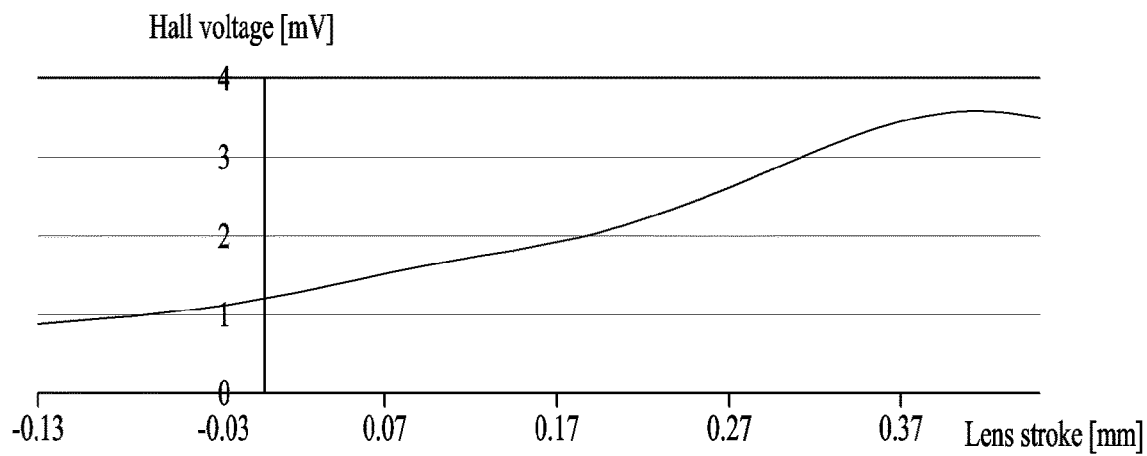
FIG. 12b illustrates the output of the position sensor illustrated in FIG. 10b.

FIG. 12a illustrates the output of the position sensor 15 illustrated in FIG. 10a, and FIG. 12b illustrates the output of the position sensor 15-1 illustrated in FIG. 10b. In FIGS. 12a and 12b, the position sensor 15 and 15-1 is a hall sensor, the x-axis represents the displacement of the bobbin 11 and 11-1, and the y-axis represents the output of the hall sensor.

Referring to FIGS. 12a and 12b, depending on the displacement of the bobbin 11 and 11-1, the output of the position sensor 15-1 of FIG. 12b is decreased by about 60% of the output of the position sensor 15 of FIG. 12a.

Figure 11:
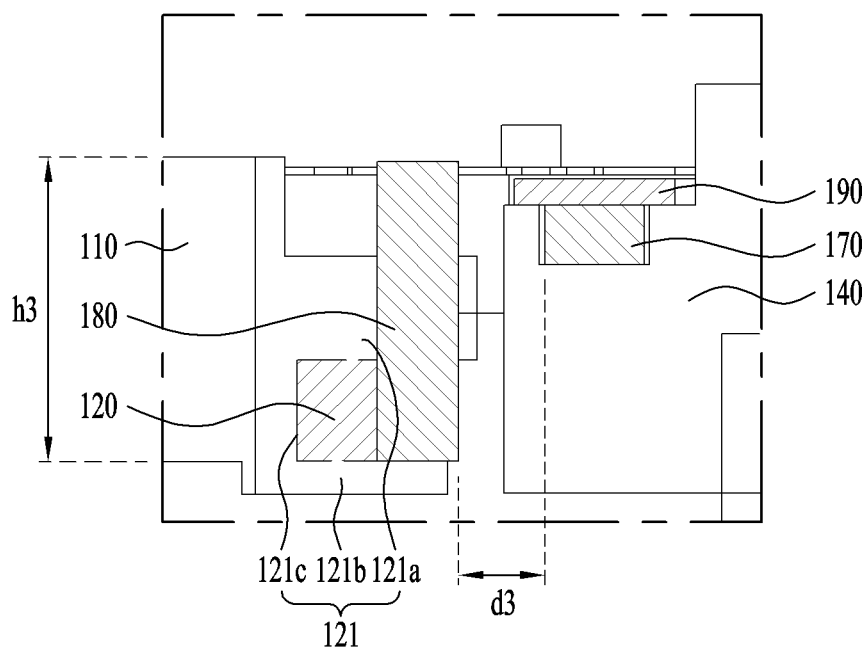
FIG. 11 illustrates the arrangement of the first coil and second magnet disposed on the bobbin and the first position sensor disposed in the housing according to an embodiment.

FIG. 11 illustrates the arrangement of the first coil 120 and the second magnet 180 disposed on the bobbin 110 and the first position sensor 170 disposed in the housing 140 according to an embodiment.

Referring to FIG. 11, since the first and second side portions S11 to S14 and S21 to S24 of the bobbin 110 are asymmetric, the second and third magnets 180 and 185 may be disposed outside the first coil 120, and may overlap the first coil 120 in a direction perpendicular to the optical axis.

Since the second and third magnets 180 and 185 overlap the first coil 120 in a direction perpendicular to the optical axis, the embodiment may reduce the length h3 of the bobbin 110 in the optical-axis direction. Accordingly, the length H1 (refer to FIG. 7) of the driving unit, for performing the AF and OIS operations, in the optical-axis direction may be reduced, and the length H2 (refer to FIG. 7) of the lens driving device 100 in the optical-axis direction may be reduced. Therefore, a camera module equipped with the lens driving device according to the embodiment, or an optical instrument, such as a cellular phone, may be reduced in thickness.

In addition, since the second and third magnets 180 and 185 are disposed outside the first coil 120, the distance d3 between the first position sensor 170, disposed in the housing 140, and the second magnet 180 in a direction perpendicular to the optical axis does not increase, like d2 of FIG. 10b. Thus, the embodiment may prevent a decrease in the output and sensing ability of the first position sensor 170.

Figure 13A:
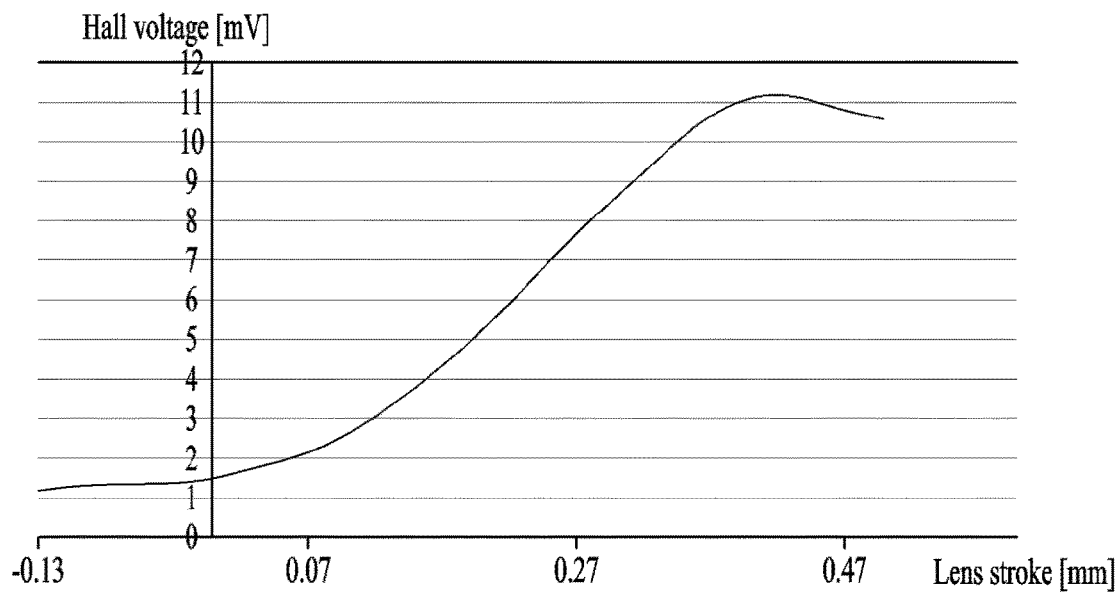
FIG. 13a illustrates the output of the first position sensor according to the embodiment of FIG. 11.

FIG. 13a illustrates the output of the first position sensor 170 according to the embodiment of FIG. 11.

Referring to FIG. 13a, since the second and third magnets 180 and 185 are disposed outside the first coil 120, the embodiment may realize output and sensing ability of the first position sensor 170 similar to those of the position sensor 15 illustrated in FIG. 12a.

Figure 13B:
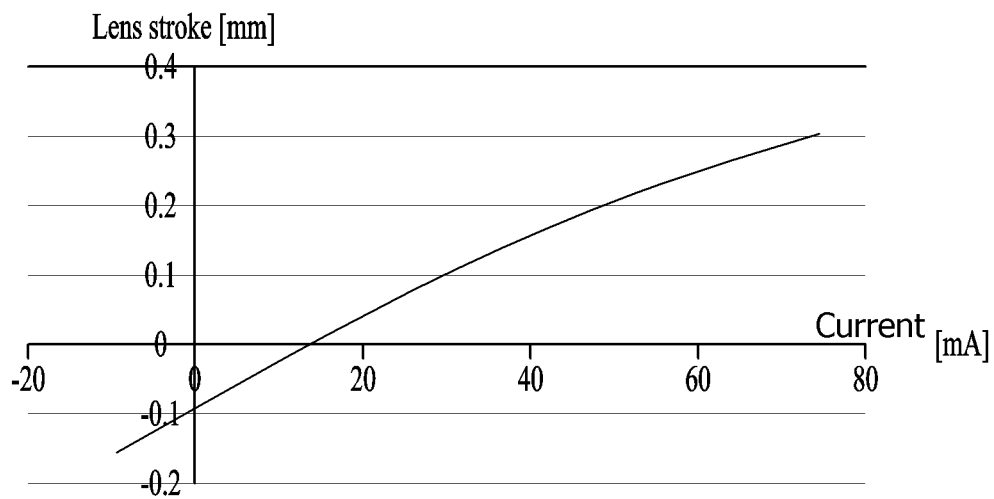
Figure 13C:
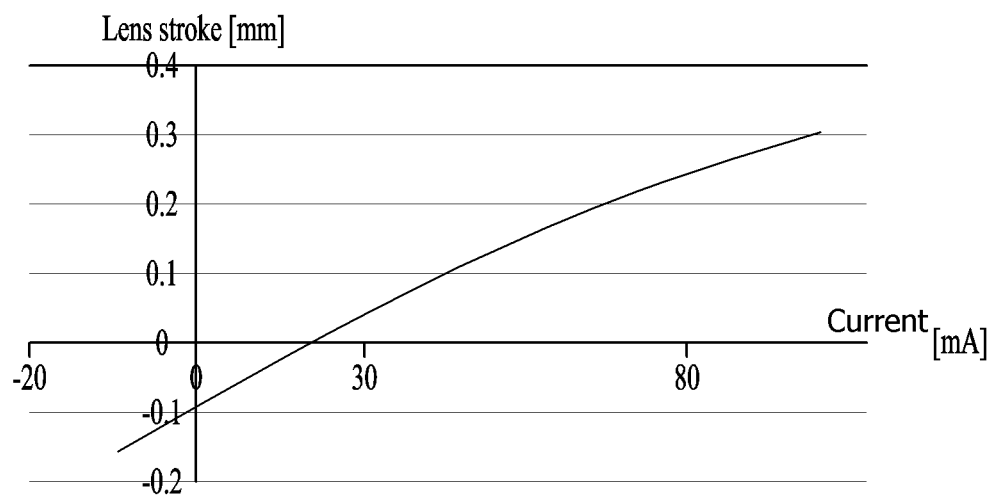
FIG. 13c illustrates the relationships between the driving current of the first coil and the displacement of the bobbin in the embodiment illustrated in FIG. 11.

FIG. 13b illustrates the relationships between the driving current of the first coil 12 and the displacement of the bobbin 11 in the embodiment illustrated in FIG. 10a, and FIG. 13c illustrates the relationships between the driving current of the first coil 120 and the displacement of the bobbin 110 in the embodiment illustrated in FIG. 11.

The difference between the displacement of the bobbin 110 depending on the driving current in the embodiment illustrated in FIG. 13c and the displacement of the bobbin 11 depending on the driving current in the embodiment illustrated in FIG. 13b is not large (about 13%), and therefore, the lens driving device 100 may be designed to maintain excellent AF performance.

The lens driving device according to the above-described embodiment may be applied to various fields, for example, a camera module, and an optical instrument including a mobile device such as a cellular phone.

Figure 14:
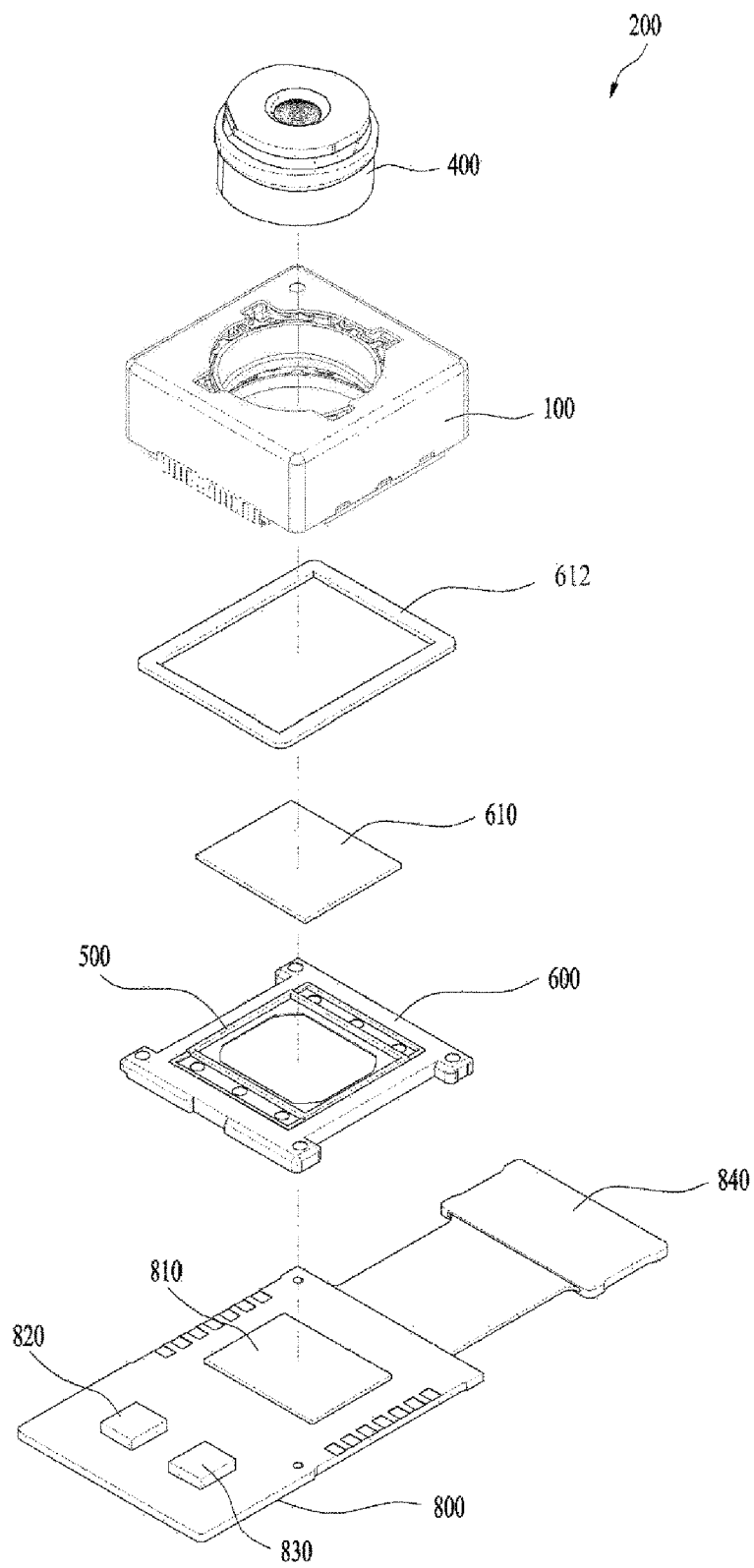
FIG. 14 illustrates an exploded perspective view of a camera module according to an embodiment.

FIG. 14 is an exploded perspective view of a camera module 200 according to an embodiment.

Referring to FIG. 14, the camera module may include a lens barrel 400, a lens driving device 100, a filter 610, an adhesive member 612, a first holder 600, a second holder 800, an image sensor 810, a motion sensor 820, a controller 830, and a connector 840.

The lens barrel 400 may be mounted in the bobbin 110 of the lens driving device 100.

The first holder 600 may be disposed under the base 210 of the lens driving device 100. The filter 610 may be mounted on the first holder 600, and the first holder 600 may include a protrusion 500 on which the filter 610 is seated.

The adhesive member 612 may couple or attach the base 210 of the lens driving device 100 to the first holder 600. The adhesive member 612 may also serve to prevent a foreign substance from being introduced into the lens driving device 100, in addition to the adhesive role described above.

For example, the adhesive member 612 may be an epoxy, a thermosetting adhesive, an ultraviolet curable adhesive, or the like.

The filter 610 may serve to block the light within a specific frequency band of the light that passes through the lens barrel 400 from being incident on the image sensor 810. The filter 610 may be an infrared-light blocking filter, without limitation thereto. Here, the filter 610 may be disposed parallel to the x-y plane.

A hollow region may be formed in a portion of the first holder 600 on which the filter 610 is mounted so that the light, which has passed through the filter 610, may be incident on the image sensor 810.

The second holder 800 may be disposed under the first holder 600, and the image sensor 810 may be mounted on the second holder 600. The image sensor 810 is an element on which the light, which has passed through the filter 610, is incident so that an image including the light is formed.

The second holder 800 may include, for example, various circuits, elements, and a controller for converting the image formed on the image sensor 810 into an electric signal and transmitting the electric signal to an external device.

The second holder 800 may be implemented as a circuit board on which the image sensor may be mounted, on which a circuit pattern may be formed, and to which various elements may be coupled.

The image sensor 810 may receive the image included in the light incident through the lens driving device 100, and may convert the received image into an electric signal.

The filter 610 and the image sensor 810 may be spaced apart from each other so as to face each other in the first direction.

The motion sensor 820 may be mounted on the second holder 800, and may be electrically connected to the controller 830 through the circuit pattern provided on the second holder 800.

The motion sensor 820 outputs rotational angular velocity information based on the motion of the camera module 200. The motion sensor 820 may be implemented as a two-axis or three-axis gyro sensor or as an angular velocity sensor.

The controller 820 may be mounted on the second holder 800, and may be electrically connected to the second position sensor 240 and the second coil 230 of the lens driving device 100. For example, the second holder 800 may be electrically connected to the circuit board 250 of the lens driving device 100, and the controller 820 mounted on the second holder 800 may be electrically connected to the second position sensor 240 and the second coil 230 through the circuit board 250.

The controller 830 may output a driving signal capable of performing hand-tremor compensation to the OIS movable unit of the lens driving device 100 based on output signals provided from the second position sensor 240 of the lens driving device 100.

The connector 840 may be electrically connected to the second holder 800, and may include a port for electrical connection to the external device.

In addition, the lens driving device 100 according to the embodiment may be included in an optical instrument for the purpose of forming an image of an object in a space using reflection, refraction, absorption, interference, or diffraction, which are characteristics of light, for the purpose of increasing visibility, for the purpose of recording and reproduction of an image by a lens, for the purpose of optical measurement or image propagation or transmission, or the like. For example, the optical instrument according to the embodiment may include a smart phone and a portable terminal equipped with a camera.

Figure 15:
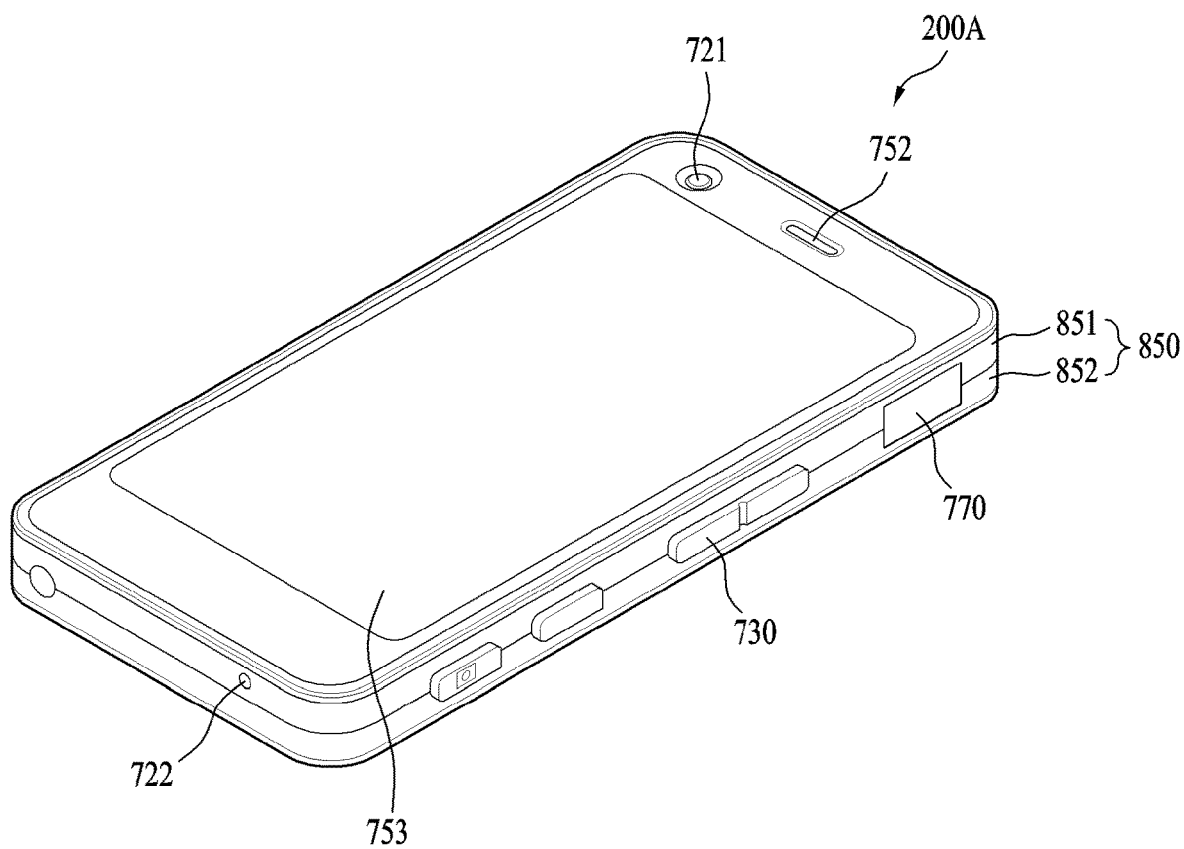
FIG. 15 illustrates a perspective view of a portable terminal according to an embodiment.
Figure 16:
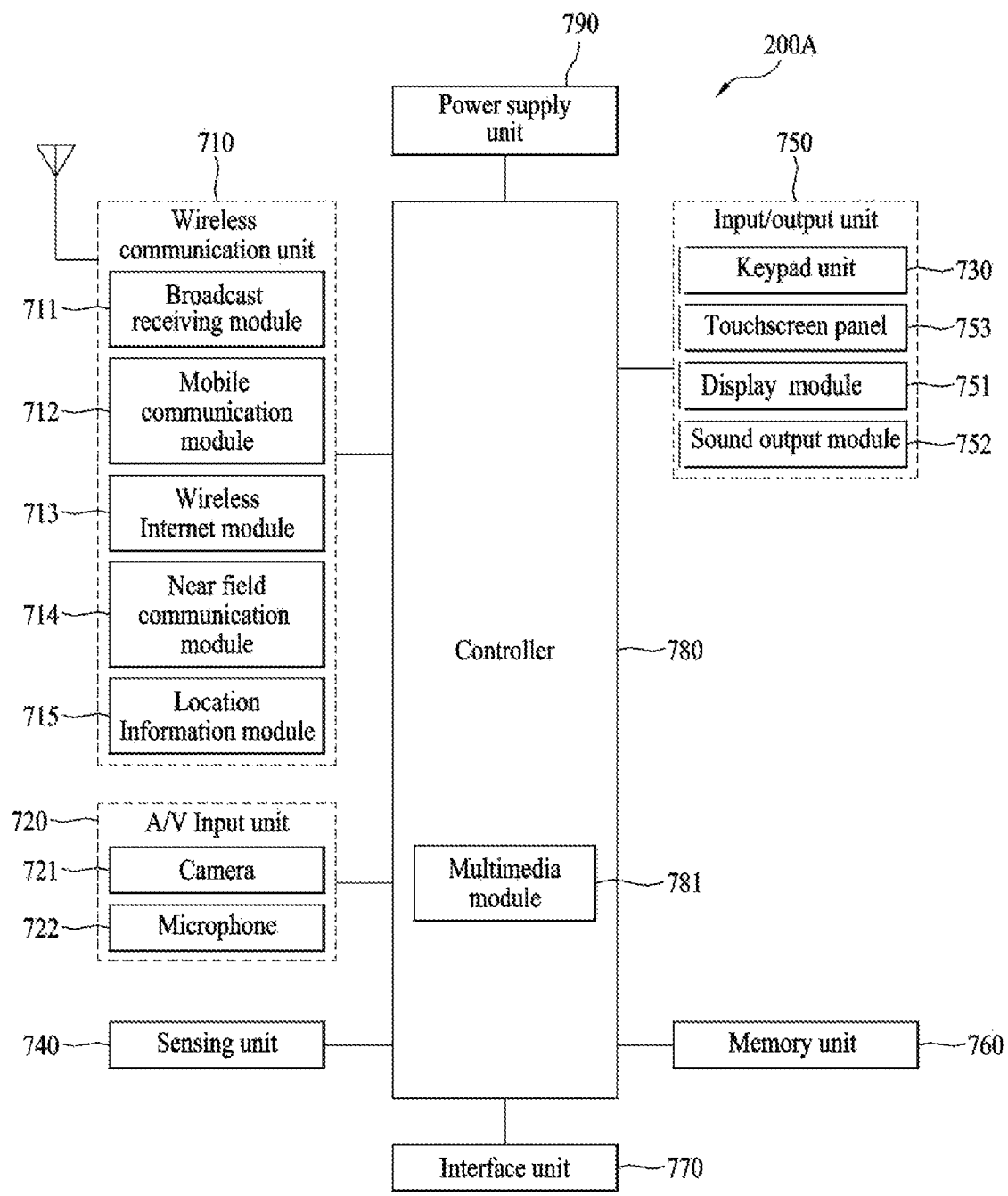
FIG. 16 illustrates the configuration of the portable terminal illustrated in FIG. 15.

FIG. 15 illustrates a perspective view of a portable terminal 200A according to an embodiment, and FIG. 16 illustrates the configuration of the portable terminal illustrated in FIG. 15.

Referring to FIGS. 15 and 16, the portable terminal 200A (hereinafter referred to as a "terminal") may include a body 850, a wireless communication unit 710, an A/V input unit 720, a sensing unit 740, an input/output unit 750, a memory unit 760, an interface unit 770, a controller 780, and a power supply unit 790.

The body 850 illustrated in FIG. 15 has a bar shape, without limitation thereto. The body 850 may be any of various types, such as a slide type, a folder type, a swing type, or a swivel type, in which two or more sub-bodies are coupled so as to be movable relative to each other.

The body 850 may include a case (e.g. a casing, a housing or a cover), which forms the external appearance thereof. For example, the body 850 may be divided into a front case 851 and a rear case 852. Various electronic components of the terminal may be embedded in the space formed between the front case 851 and the rear case 852.

The wireless communication unit 710 may include one or more modules that enable wireless communication between the terminal 200A and a wireless communication system or between the terminal 200A and the network in which the terminal 200A is located. For example, the wireless communication unit 710 may include a broadcast receiving module 711, a mobile communication module 712, a wireless Internet module 713, a near field communication module 714, and a location information module 715.

The audio/video (A/V) input unit 720 may serve to input an audio signal or a video signal, and may include a camera 721 and a microphone 722, for example.

The camera 721 may be the camera module 200 including the lens driving device 100 according to the embodiment.

The sensing unit 740 may sense the current state of the terminal 200A, such as the opened/closed state of the terminal 200A, the position of the terminal 200A, the presence or absence of a user touch, the orientation of the terminal 200A, or the acceleration/deceleration of the terminal 200A, and may generate a sensing signal for controlling the operation of the terminal 200A. For example, when the terminal 200A takes the form of a slide phone, the sensing unit may sense whether the slide phone is opened or closed. In addition, the sensing unit functions to sense whether or not the power supply unit 790 supplies power or whether or not the interface unit 770 is connected to an external device, for example.

The input/output unit 750 serves to generate input or output that is visual, auditory, tactile, or the like. The input/output unit 750 may generate input data for controlling the operation of the terminal 200A and may also display information processed by the terminal 200A.

The input/output unit 750 may include a keypad unit 730, a display module 751, a sound output module 752, and a touchscreen panel 753. The keypad unit 730 may generate input data based on input to a keypad.

The display module 751 may include a plurality of pixels, the color of which changes in response to an electric signal. For example, the display module 751 may include at least one of a liquid crystal display, a thin-film-transistor liquid crystal display, an organic light-emitting diode, a flexible display, or a 3-dimensional (3D) display.

The sound output module 752 may output audio data received from the wireless communication unit 710 in a call signal reception mode, a call mode, a recording mode, a voice recognition mode, a broadcast reception mode, or the like, or may output audio data stored in the memory unit 760.

The touchscreen panel 753 may convert a change in capacitance caused by a user touch on a specific area of the touchscreen into an electric input signal.

The memory unit 760 may store a program for processing and controlling the controller 780 and may temporarily store input/output data (e.g. a telephone directory, a message, audio, a still image, a photograph, or a moving image). For example, the memory unit 760 may store an image captured by the camera 721, for example, a photograph or a moving image.

The interface unit 770 serves as a path for connection to an external device connected to the terminal 200A. The interface unit 770 receives data from an external device, receives power to transmit the power to each element in the terminal 200A, or allows data in the terminal 200A to be transmitted to an external device. For example, the interface unit 770 may include a wired/wireless headset port, an external charger port, a wired/wireless data port, a memory card port, a port for connecting a device equipped with an identification module, an audio input/output (I/O) port, a video input/output (I/O) port, and an earphone port.

The controller 780 may control the overall operation of the terminal 200A. For example, the controller 780 may perform a related control operation and process for a voice call, data communication, a video call, and the like. The controller 780 may include a panel controller 144 of the touchscreen panel driving unit illustrated in FIG. 1, or may function as the panel controller 144.

The controller 780 may include a multimedia module 781 for multimedia playback. The multimedia module 781 may be implemented in the controller 180, or may be implemented separately from the controller 780.

The controller 780 may perform a pattern recognition process for recognizing handwriting input or drawing input performed on the touchscreen as characters and images, respectively.

The power supply unit 790 may receive external power or internal power under the control of the controller 780, and may supply the power required for the operation of respective elements.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as falling within the scope and spirit of the invention as disclosed in the accompanying claims.

INDUSTRIAL APPLICABILITY

Embodiments may be used in a lens driving device, which is capable of reducing a height in an optical-axis direction and preventing a reduction in output and sensing ability of a position sensor, and a camera module and an optical apparatus including the same.

The invention claimed is:
1. A lens driving device comprising:
 a housing;
 a bobbin disposed in the housing;
 a first coil disposed on an outer surface of the bobbin;
 a first magnet disposed on the housing;
 a second magnet disposed on the bobbin; and
 a position sensor disposed opposite to the second magnet in order to sense a strength of a magnetic field of the second magnet,
 wherein a portion of the second magnet overlaps with the first coil in a direction perpendicular to an optical axis, and
 wherein a portion of the first coil is disposed between the outer surface of the bobbin and the portion of the second magnet.
2. The lens driving device according to claim 1, wherein the second magnet is disposed outside the first coil.
3. The lens driving device according to claim 1, wherein the portion of the second magnet is disposed outside the first coil, and the outside of the first coil is a region that is opposite the optical axis with respect to the first coil.
4. The lens driving device according to claim 1, further comprising a third magnet disposed at a position opposite to the second magnet with respect to the optical axis, and wherein the third magnet is disposed outside the first coil.

5. The lens driving device according to claim 1, wherein the first coil is disposed between the second magnet and the bobbin.

6. The lens driving device according to claim 1, wherein the second magnet is disposed at a position corresponding to a corner portion of the housing.

7. The lens driving device according to claim 4, wherein a portion of the third magnet overlaps the first coil in the direction perpendicular to the optical axis.

8. The lens driving device according to claim 4, wherein a first seating groove is formed at a portion of the bobbin and the second magnet is disposed in the first seating groove, and
wherein a second seating groove is formed at another portion of the bobbin and the third magnet is disposed in the second seating groove.

9. The lens driving device according to claim 8, wherein a coil seating groove is formed at the bobbin and the first coil is disposed in the coil seating groove.

10. The lens driving device according to claim 1, wherein, at an initial position of the bobbin, when no current for driving the lens driving device is applied to the first coil, the position sensor overlaps the second magnet in the direction perpendicular to the optical axis.

11. The lens driving device according to claim 1, further comprising:
an upper elastic member coupled to the bobbin and the housing; and
a circuit board electrically connected to the position sensor and disposed on the housing,
wherein the circuit board is electrically connected to the upper elastic member.

12. The lens driving device according to claim 1, wherein the housing comprises first side portions and second side portions,
wherein the bobbin comprises first side portions corresponding to the first side portions of the housing and second side portions corresponding to the second side portions of the housing,
wherein the first magnet is disposed on the first side portions of the housing, and
wherein the second magnet is disposed on one of the second side portions of the bobbin.

13. The lens driving device according to claim 12, wherein the second side portions of the housing are corner portions of the housing.

14. The lens driving device according to claim 10, wherein at the initial position of the bobbin, the position sensor does not overlap the first coil in the direction perpendicular to the optical axis.

15. A camera module comprising:
a lens barrel;
the lens driving device according to claim 1, and
an image sensor.

16. An optical apparatus comprising:
a display module including a plurality of pixels,
the camera module according to claim 2; and
a controller configured to control an operation of the display module and the camera module.

17. A lens driving device comprising:
a housing;
a bobbin disposed in the housing;
a first coil disposed on an outer surface of the bobbin;
a first magnet disposed on the housing;
a second magnet disposed on the bobbin; and
a position sensor disposed opposite to the second magnet in order to sense the second magnet,
wherein the bobbin comprises a seating groove,
wherein the second magnet is disposed in the seating groove, and
wherein a portion of the second magnet is disposed between the first coil and the position sensor.

18. The lens driving device according to claim 17, further comprising a third magnet disposed at a position opposite to the second magnet with respect to an optical axis.

19. The lens driving device according to claim 17, wherein a portion of the second magnet overlaps with the first coil in a direction perpendicular to an optical axis.

20. The lens driving device according to claim 19, wherein the portion of the second magnet is disposed outside the first coil, and the outside of the first coil is a region that is opposite the optical axis with respect to the first coil.

21. The lens driving device according to claim 18, wherein a portion of the second magnet overlaps with the first coil in a direction perpendicular to the optical axis, and
wherein a portion of the third magnet overlaps with the first coil in the direction perpendicular to the optical axis.

22. The lens driving device according to claim 21, further comprising a third magnet disposed at a position opposite to the second magnet with respect to the optical axis,
wherein the portion of the second magnet is disposed outside the first coil, and wherein the portion of the third magnet is disposed outside the first coil.

23. A lens driving device comprising:
a housing;
a bobbin disposed in the housing;
a first coil disposed on an outer surface of the bobbin;
a first magnet disposed on the housing;
a second magnet disposed on the bobbin; and
a position sensor disposed opposite to the second magnet in order to sense the second magnet,
wherein the bobbin comprises a seating groove,
wherein the second magnet is disposed in the seating groove, and
wherein a lower portion of the second magnet overlaps with the first coil in a direction perpendicular to an optical axis, and
wherein the lower portion of the second magnet is disposed between the first coil and the housing.

* * * * *